United States Patent
Hohe et al.

(10) Patent No.: US 8,203,329 B2
(45) Date of Patent: Jun. 19, 2012

(54) CALIBRATABLE MULTIDIMENSIONAL MAGNETIC POINT SENSOR

(75) Inventors: Hans-Peter Hohe, Heiligenstadt (DE); Michael Hackner, Hemau Ot Haag (DE); Markus Stahl-Offergeld, Erlangen (DE)

(73) Assignee: Fraunhofer-Gesellschaft zur Foerderung der Angewandten Forschung E.V., Munich (DE)

( * ) Notice: Subject to any disclaimer, the term of this patent is extended or adjusted under 35 U.S.C. 154(b) by 12 days.

(21) Appl. No.: 12/675,580
(22) PCT Filed: Aug. 19, 2008
(86) PCT No.: PCT/EP2008/006808
§ 371 (c)(1), (2), (4) Date: Oct. 28, 2010
(87) PCT Pub. No.: WO2009/030361
PCT Pub. Date: Mar. 12, 2009

(65) Prior Publication Data
US 2011/0031960 A1 Feb. 10, 2011

(30) Foreign Application Priority Data
Aug. 31, 2007 (DE) .......................... 10 2007 041 230

(51) Int. Cl.
*G01R 35/00* (2006.01)
(52) U.S. Cl. ........................... 324/202; 702/85; 702/104
(58) Field of Classification Search .................. 324/202; 702/85, 104
See application file for complete search history.

(56) References Cited

U.S. PATENT DOCUMENTS
6,768,301 B1 7/2004 Hohe et al.

FOREIGN PATENT DOCUMENTS
DE 10150950 6/2003
(Continued)

OTHER PUBLICATIONS
Burger, F., et al.; "New fully integrated 3-D silicon Hall sensor for precise angular-position measurements"; May 1998; In: Sensor and Actuators A 67, pp. 72-76.
(Continued)

*Primary Examiner* — Bot Ledynh
(74) *Attorney, Agent, or Firm* — Michael A. Glenn; Glenn Patent Group

(57) ABSTRACT

A calibratable magnetic field sensor for sensing a first and a second spatial component of a magnetic field in a reference point, wherein the magnetic field includes a first and a second measurement field component and/or a first and a second calibration field component. The magnetic filed sensor includes a first sensor element arrangement including at least a first and a second sensor element for sensing the first magnetic field component, which includes a first measurement field component and/or a first calibration field component, with respect to a first spatial axis in the reference point. Furthermore, the magnetic field sensor includes a second sensor element arrangement for sensing the second magnetic field component, which includes a second measurement field component and/or a second calibration field component, with respect to a second spatial axis in the reference point. The magnetic filed sensor also includes an excitation line arranged with respect to the first sensor element arrangement so that, when impressing a default current into the excitation line, a pair of different asymmetrical default calibration field components in the first sensor element and in the second sensor element is generated with respect to the first spatial axis in the first sensor element arrangement, wherein the two spatial axes pass along linearly independent position vectors.

27 Claims, 13 Drawing Sheets

FOREIGN PATENT DOCUMENTS

DE 102005008724 A1 9/2006
DE 10150955 C1 2/2008

OTHER PUBLICATIONS

Demierre M, et al.; "Reference Magnetic Actuator for Self-Calibration of a Very Small Hall Sensor Array"; Apr. 2002; Sensors and Actuators A, Elsevier Sequoia S.A., Lausanne, CH, vol. 97-98, pp. 39-46, XP004361580.

Kayal, et al.: "Automatic Calibration of Hall Sensor Microsystems"; Nov. 11, 2006; Microelectronics Journal, Mackintosh Publications Ltd. Luton, GB, vol. 37, Nr. 12, pp. 1569-1575, XP005728300.

Popovic, R.S.; "Hall Effect Devices, Magnetic Sensors and Characterization of Semiconductors", 1991, Adam Hilger, pp. 182-203, ISBN 0-7503-0096-5.

Schott, C. et al.: "Single-Chip 3-D Silicon Hall Sensor"; May 2000; Sensors and Actuators A, Elsevier Sequoia S.A., Lausanne, CH, vol. 82, Nr. 1-3, pp. 167-173, XP004198257.

Schott, et al.; "Integrated 3D Hall Magnetic Field Sensor", Jun. 7-10, 1999; Transducers '99, Sendai, Japan, vol. 1, pp. 168-171.

Schurig, E.; "Highly Sensitive Vertical Hall Sensors in CMOS Technology", Hartung-Gore Verlag Konstanz, 2005, Reprinted from EPFL Thesis No. 3134 (2004), ISSN 1438-0609, ISBN 2-86628-023-8 WW. pp. 185-188.

Trontelj, Janez, "Optimization of Integrated Magnetic Sensor by Mixed Signal Processing"; May 1999; In the Proceedings of the 16th IEEE Conf. on Instrumentation and Measurement Technology; vol. 1.

Translation of Decision to Grant in parallel German application DE102007041230.6-35, dated May 11, 2001, 3 pages.

English translation if Int'l Preliminary Report on Patentability mailed on Jul. 8, 2010 in parallel application PCT/EP2008/006808, 8 pages.

US 8,203,329 B2

CALIBRATABLE MULTIDIMENSIONAL MAGNETIC POINT SENSOR

CROSS-REFERENCE TO RELATED APPLICATIONS

This application is a National Phase of PCT/EP2008/006808 filed 19 Aug. 2007, which claims priority from German Patent Application No. 102007041230.6-35, which was filed on 31 Aug. 2007, and is incorporated herein in its entirety by reference.

BACKGROUND OF THE INVENTION

The present invention relates to magnetic field sensors and, in particular, to Hall sensors for detecting spatial components of a magnetic field in a reference point, the sensors being in particular calibratable during measuring operation, and to the calibration and measuring methods employed here.

Apart from measuring magnetic fields as to magnitude and direction, Hall sensor elements which are based on the Hall effect are frequently employed in technology for non-contact contactless signal generators for detecting the position of switches or control elements in a wear-free manner. Another way of application is measuring a current, wherein a Hall sensor element is placed close to a conductive trace and measures, in a non-contact manner, the current in the conductive trace via detecting the magnetic field generated by the current in the conductive trace. In practical applications, Hall sensor elements excel, in particular, by their relatively great insensitivity to external influences, such as, for example, contaminations and the like.

In technology, both so-called horizontal or lateral Hall sensor elements and vertical Hall sensor elements are known, FIG. 6a exemplarily illustrating a horizontal Hall sensor element and FIG. 6b illustrating a known vertical Hall sensor element.

A Hall sensor element is generally made up of a semiconductor wafer having four contact terminals which are provided for an electrical connection to an external control circuit. Of the four contact terminals of a Hall sensor element, two contact terminals are provided for impressing an operating current through an active semiconductor region, whereas the other two contact terminals are provided for detecting the Hall voltage. When the semiconductor wafer through which the operating current flows is exposed to a magnetic field having an induction $\vec{B}$, the result will be a deflection in the current paths which is caused by the "Lorenz force" acting on the moved charge carriers in the magnetic field. The Hall voltage will be perpendicular to the direction of the current flow and perpendicular to the magnetic field applying in the active semiconductor region.

As is basically illustrated in FIG. 6a, a known horizontal Hall sensor element 600 is generally made up of an n-type doped semiconductor region 602 on a p-type doped semiconductor substrate 604. A Hall sensor element which is arranged in parallel to a chip surface (x-y plane) is referred to as horizontal.

The n-type doped active region 602 is typically connected to external control or evaluation logic via four contact electrodes 606a-d which are arranged in pairs opposite each other in the active region 602. The control or evaluation logic is not illustrated in FIG. 6 for clarity reasons. The four contact electrodes 606a-d are divided into two opposite control current contact electrodes 606a and 606c which are provided to generate a current flow $I_H$ through the active region 602, and additionally into two opposite voltage tapping contact electrodes 606b and 606d which are provided for tapping as a sensor signal a Hall voltage $U_H$ occurring in a magnetic field $\vec{B}$ applying perpendicular to the current flow in the active region 602 and the magnetic field applying. By impressing the current flow $I_H$ between different contact electrodes and correspondingly tapping the Hall voltage $U_H$ at the other contact electrodes perpendicular to the current flow, compensation methods which allow compensating tolerances which occur in the Hall sensors, for example, due to manufacturing tolerances, etc., over several measuring cycles may be implemented.

As can be seen from the horizontal Hall sensor element 600 illustrated in FIG. 6a, the active region between the contact terminals 606a-d is defined such that the active region has an effective length L and an effective width W. The horizontal Hall sensor elements 600 illustrated in FIG. 6a are relatively easy to manufacture using conventional CMOS (Complementary Metal Oxide Semiconductor) processes for manufacturing semiconductor structures.

Apart from the horizontal Hall sensor elements, realizations of so-called vertical Hall sensor arrangements which also allow standard semiconductor manufacturing technologies, such as, for example, CMOS processes to be used, are also known. An example of a vertical Hall sensor element 620 is basically illustrated in FIG. 6b, wherein vertical here means a plane perpendicular to the plane of the chip surface (X-Y plane). In the vertical Hall sensor element 620 illustrated in FIG. 6b, the advantageously n-type doped active semiconductor region 622 extends in the form of a well in a p-type doped semiconductor substrate 624, the active semiconductor region 622 having a depth T. As is illustrated in FIG. 6b, the vertical Hall sensor element comprises three contact regions 626a-c which are arranged in the semiconductor substrate 624 adjacent to the main surface thereof, the contact terminals 626a-c being all arranged in the active semiconductor region 622. Due to the three contact regions, this variation of vertical Hall sensor elements is also referred to as 3-pin sensor.

The vertical Hall sensor element 620 illustrated in FIG. 6b also comprises three contact regions 626a-c along the main surface of the active semiconductor region 622, the contact region 626a being connected to a contact terminal A, the contact region 626b being connected to a contact terminal B and the contact region 626c being connected to a contact terminal C. When a voltage is applied between the two contact terminals A and C, the result will be a current flow $I_H$ through the active semiconductor region 622 and a Hall voltage $U_H$ which is oriented to be perpendicular to the current flow $I_H$ and to the magnetic field $\vec{B}$ can be measured at the contact terminal B. The effectively active regions of the active semiconductor region 622 are predetermined by the depth T of the active semiconductor region 622 and the length L corresponding to the distance between the current feeding contact electrodes 626a and 626c.

Horizontal and vertical Hall sensors and methods for reducing offsets which form due to element tolerances, such as, for example, contaminations, asymmetries, piezoelectric effects, aging phenomena, etc., like, for example, using the spinning-current method, are already known in literature, such as, for example, in R. S. Popovic, "Hall Effect Devices, Magnetic Sensors and Characterization of Semiconductors", Adam Hilger, 1991, ISBN 0-7503-0096-5. Frequently, vertical sensors operated in a spinning-current manner are made up of two or of four individual sensors, as is described, for example, in DE 101 50 955 and DE 101 50 950.

In addition, apart from the variation of 3-pin vertical Hall sensor elements, there are so-called 5-pin vertical Hall sensor elements which are also described in DE 101 50 955 and DE 101 50 950. In 5-pin Hall sensor elements, too, there is a way of performing a measurement compensated for tolerances of individual elements by means of a compensation method extending over several measuring phases, wherein exemplarily a spinning-current method may also be employed here.

Spinning-current technique means continuously cyclically turning the measurement direction for detecting the Hall voltage at the Hall sensor element using a certain clock frequency by, for example, 90° and summing over all the measuring signals of a complete turn of 360°. In a Hall sensor element comprising four contact regions of which two respective contact regions are arranged in pairs to each other, each of the contact pairs is, depending on the spinning-current phase, used both as a control current contact region for feeding a current and as a measuring contact region for tapping the Hall signal. Thus, in a spinning-current phase or in a spinning-current cycle, the operating current (control current $I_H$) flows between two associated contact regions, the Hall voltage being tapped at the other two contact regions associated to each other.

In the next cycle, the measuring direction is turned by 90°, so that the contact regions which, in the previous cycle, were used for tapping the Hall voltage, now serve for feeding the control current. By summing over all the four cycles or phases, the offset voltages due to manufacturing or material approximately cancel out one another, so that only the portions of the signal which really are dependent on the magnetic field will remain. This procedure is, of course, also applicable for a greater number of contact pairs, wherein exemplarily, with four contact pairs (comprising eight contact regions), the spinning-current phases are cyclically turned by 45° in order to be able to sum all the measuring signals over a full 360° turn.

In horizontal Hall sensors, four sensors are also frequently used, since, with a suitable arrangement, the offset can additionally be reduced significantly by spatial spinning-current operation, see, for example, DE 199 43 128.

When a magnetic field is to be measured for several spatial directions, separate Hall sensor elements are most frequently used. Using separate sensors, for example for detecting the three spatial directions of a magnetic field, generally entails the problem that the magnetic field to be measured is not measured in one point, but in three different points. FIG. 7 makes this aspect clear, FIG. 7 showing three Hall sensors 702, 704 and 706. The first Hall sensor 702 serves for detecting a y spatial component, the second Hall sensor 704 serves for detecting a z spatial component and the third Hall sensor 706 is provided for detecting an x spatial component. The individual sensors 702, 704 and 706 measure the corresponding spatial components of a magnetic field approximately in the respective central points of the individual sensors.

An individual sensor, in turn, may be made up of several Hall sensor elements. FIG. 7 exemplarily shows three individual sensors which each comprise four Hall sensor elements, wherein, in FIG. 7, a horizontal Hall sensor 704 detecting a z component of the magnetic field to be measured and one vertical Hall sensor 702 and 706 each for the y and x components of the magnetic field to be measured are assumed. The arrangement for detecting the spatial magnetic field components, as is exemplarily illustrated in FIG. 7, entails the problem that the magnetic field cannot be measured in one point, but in the respective central points of the individual sensors. This inevitably entails corruption, since an exact evaluation of the magnetic field based on the magnetic field components, detected at different locations, of the magnetic field sensor, is not possible.

Another aspect when detecting and evaluating magnetic fields by means of Hall sensor elements is calibration of the individual elements. According to conventional technology, Hall sensor elements are most frequently provided with so-called excitation lines which allow generating a defined magnetic field in the measuring point of an individual sensor in order to achieve the sensor to be calibrated subsequently by comparing and/or associating the Hall voltage measured to the defined magnetic field.

It is possible using excitation lines to generate an artificial magnetic field at a Hall sensor by means of which a simple wafer test, i.e. a test directly on the substrate, and a self-test and sensitivity calibration during operation are possible, compare Janez Trontelj, "Optimization of Integrated Magnetic Sensor by Mixed Signal Processing, Proceedings of the $16^{th}$ IEEE Vol. 1. This is of particular interest in safety-critical sectors, such as, for example, in the automobile sector or also in medical engineering, since this allows the sensors to monitor themselves even during operation.

When exemplarily several individual sensors are used for detecting the spatial components of a magnetic field, as is exemplarily shown in FIG. 7, each individual sensor necessitates a corresponding excitation line for calibration, wherein the individual sensors are still calibrated individually. This means that the calibration effort is scaled depending on the number of individual sensor elements and, in the case of spatially detecting three magnetic field components, is increased by three compared to the calibration effort of an individual sensor.

One approach of allowing a magnetic field to be evaluated, i.e. detecting a measurement in one point, is a 3D sensor made by Ecole Polytechnique Federal Lausanne EPFL, compare C. Schott, R. S. Popovic, "Integrated 3D Hall Magnetic Field Sensor", Transducers '99, June 7-10, Sensai, Japan, VOL. 1, pages 168-171, 1999. FIG. 8 is a schematic illustration of such a Hall sensor 800 implemented on a semiconductor substrate 802. The 3D sensor comprises four contact areas 804a-d via which currents can be impressed into the semiconductor substrate 802. The 3D sensor additionally comprises four measuring contact areas 806a-d via which the different magnetic field components can be detected. Wiring 810 is illustrated on the right side of FIG. 8. The wiring shown made up of four operational amplifiers 812a-d evaluates the Hall voltages proportional to the individual magnetic field components and outputs the corresponding components at the terminals 814a-c in the form of signals Vx, Vy and Vz.

The sensor illustrated entails the problem that it can only be calibrated by a defined magnetic field generated externally and has no excitation line of its own. Additionally, due to its set-up and its mode of functioning, this sensor cannot be operated using a compensation method, such as, for example, a spinning-current method. Furthermore, a problem of the arrangement shown in FIG. 8 is that such a semiconductor element, due to contaminations of the semiconductor material, asymmetries in contacting, variations in the crystalic structure, etc., exhibits offset voltages which cannot be suppressed using a corresponding compensation wiring suitable for spinning current. The sensor measures magnetic field components in a focused point, however, it exhibits a high offset and consequently is suitable for precise measurements to a limited extent only. FIG. 9 shows a compensation-enabled (spinning-current) 3D-sensor which detects spatial magnetic field components in one measuring point and is discussed by Enrico Schurig in "Highly Sensitive Vertical Hall Sensors in CMOS Technology", Hartung-Gorre Verlag Konstanz, 2005, Reprinted from EPFL Thesis No. 3134 (2004), ISSN 1438-0609, ISBN 3-86628-023-8 WW. page 185ff. In the top part of FIG. 9, the 3D-sensor of FIG. 7 made up of three individual sensors is shown. FIG. 9, in the top part, shows three separate individual sensors 902, 904 and 906 for detecting the spatial magnetic field components. In FIG. 9, in the bottom part, an alternative arrangement of the individual sensors is shown. With this arrangement, the sensor 904 is maintained unchanged since the measuring point of the sensor 904 in FIG. 9 is in the center of the arrangement 900, additionally the two individual sensors 902 and 906 are made up of individual elements which are separable. The sensor 902 is now divided into two sensor parts 902a and 902b and symmetrically arranged around the central point of the sensor element 904. An analogue procedure is done for the sensor 906 so that this one, too, is divided into two sensor parts 906a and 906b which are symmetrically arranged around the central point of the sensor element 904, along the corresponding spatial axis. Due to the symmetrical arrangement of the individual sensor elements, the magnetic field is then detected in one point which is in the geometrical center of the arrangement.

In summary, one might say that individual sensors which are symmetrical arranged around a central point may be used in the field of conventional technology for measuring multidimensional magnetic fields. Arrangements of this kind can, in particular, be realized in angular sensors where a magnetic field is to be measured in one point by all the sensors. Monitoring, calibration and testing of the sensors, however, are problematic in these arrangements.

SUMMARY

According to an embodiment, a calibratable magnetic field sensor for sensing a first and a second spatial component of a magnetic field in a reference point, wherein the magnetic field has a first and a second measurement field component and/or a first and a second calibration field component, may have: a first sensor element arrangement having at least a first and a second sensor element for sensing the first magnetic field component, which has a first measurement field component and/or a first calibration field component, with respect to a first spatial axis in the reference point; a second sensor element arrangement for sensing the second magnetic field component, which has a second measurement field component and/or a second calibration field component, with respect to a second spatial axis in the reference point, wherein the two spatial axes pass along linearly independent position vectors; an excitation line arranged with respect to the first sensor element arrangement so that, when impressing a default current into the excitation line, a pair of different asymmetrical default calibration field components in the first sensor element and in the second sensor element is generated with respect to the first spatial axis.

According to another embodiment, a method for sensing a first and a second spatial component of a magnetic field in a reference point, wherein the magnetic field has a first and a second measurement field component and/or a first and a second calibration field component, may have the steps of: sensing, in a first and a second sensor element of a first sensor element arrangement, a first pair of magnetic field components, which have first measurement field components and/or first calibration field components, with respect to a first spatial axis in the reference point; sensing, in a second sensor element arrangement, second magnetic field components, which have second measurement field components and/or second calibration field components, with respect to a second spatial axis in the reference point, wherein the two spatial axes pass along linearly independent position vectors; and generating a first pair of different asymmetrical calibration field components with respect to the first spatial axis in the first and the second sensor element of the first sensor element arrangement.

According to another embodiment, a computer program may a program code for performing, when the program code is executed on a computer, a method for sensing a first and a second spatial component of a magnetic field in a reference point, wherein the magnetic field has a first and a second measurement field component and/or a first and a second calibration field component, wherein the method may have the steps of: sensing, in a first and a second sensor element of a first sensor element arrangement, a first pair of magnetic field components, which have first measurement field components and/or first calibration field components, with respect to a first spatial axis in the reference point; sensing, in a second sensor element arrangement, second magnetic field components, which have second measurement field components and/or second calibration field components, with respect to a second spatial axis in the reference point, wherein the two spatial axes pass along linearly independent position vectors; and generating a first pair of different asymmetrical calibration field components with respect to the first spatial axis in the first and the second sensor element of the first sensor element arrangement.

In one embodiment, the present invention provides a calibratable magnetic field sensor for sensing a first and a second spatial component of a magnetic field in a reference point, wherein the magnetic field comprises a first and a second measurement field component and/or a first and a second calibration field component, having a first sensor element arrangement comprising at least a first and a second sensor element for sensing the first magnetic field component, which comprises a first measurement field component and/or a first calibration field component, with respect to a first spatial axis in the reference point. Furthermore, the magnetic filed sensor includes a second sensor element arrangement for sensing the second magnetic field component, which comprises a second measurement field component and/or a second calibration field component, with respect to a second spatial axis in the reference point. The magnetic filed sensor also includes an excitation line arranged with respect to the first sensor element arrangement so that, when impressing a default current into the excitation line, a pair of different asymmetrical default calibration field components in the first sensor element and in the second sensor element is generated with respect to the first spatial axis in the first sensor element arrangement, wherein the two spatial axes pass along linearly independent position vectors.

In another embodiment, the present invention provides a magnetic field sensor, calibratable during measuring operation, for detecting first, second and third spatial components $B_z$, $B_y$ and $B_x$ of a magnetic field in a reference point, the magnetic field comprising first, second and third measuring field components $B_{Mz}$, $B_{My}$, $B_{Mx}$ and/or first, second and third calibration field components $B_{Kz}$, $B_{Ky}$ and $B_{Kx}$. The magnetic field sensor includes a first sensor element arrangement having at least two sensor elements, for detecting the first magnetic field component $B_z$ which comprises a first measuring field component $B_{Mz}$ and/or a first calibration field component $B_{Kz}$, relative to a first spatial axis z in the reference point.

Additionally, the magnetic field sensor includes a second sensor element arrangement having at least two sensor elements, for detecting the second magnetic field component $B_y$ which comprises a second measuring field component $B_{My}$ and/or a second calibration field component $B_{Ky}$, relative to a second spatial axis y in the reference point. The magnetic field sensor additionally includes a third sensor element arrangement having at least two sensor elements, for detecting the third magnetic field component $B_x$ which comprises a third measuring field component $B_{Mx}$ and/or a third calibration field component $B_{Kx}$, relative to a third spatial axis x in the reference point. Additionally, the magnetic field sensor comprises an excitation line which is arranged relative to the first, second and third sensor element arrangements such that when impressing a predetermined current $I_{k1}$ into the excitation line, a first pair of different predetermined calibration field component $B_{Kza}$ and $B_{Kzb}$ is generated in the first sensor element arrangement relative to the first spatial axis z, a second pair of different predetermined calibration field components $B_{Kya}$ and $B_{Kyb}$ is generated in the second sensor element arrangement relative to the second spatial axis y and a third pair of different predetermined calibration field components $B_{Kxa}$ and $B_{Kxb}$ is generated in the third sensor element arrangement relative to the third spatial axis x, the three spatial axes z, y and x extending along linearly independent position vectors.

The present invention is based on the finding that advantageously symmetrically arranged sensor elements in pairs are able to provide a magnetic field sensor for a multidimensional detection of a magnetic field, which becomes calibratable when using at least one asymmetrical excitation line. The excitation line thus is asymmetrical relative to the sensor elements arranged in pairs in that the magnetic field which may be generated by applying a current using the excitation line causes unequal calibration field components in the sensor elements arranged in pairs. Thus, sensor elements of equal sensitivity may be used here because different calibration field components the difference of which is measurable and calibratable using the magnetic field sensors result due to the mentioned asymmetry. When using embodiments of inventive magnetic field sensors, two-dimensional and even three-dimensional magnetic fields can be detected along two and three linearly independent position vectors, respectively.

Several excitation lines which, relative to the sensor elements arranged in pairs, may comprise different or also mirrored or opposite asymmetries may also be used. Exemplarily, the excitation lines may form coils the magnetic fields of which are superimposed onto one another and thus cause a resulting excitation field in the direction of sensitivity of a sensor element. This has an advantageous effect since the magnetic field sensor may thus be implemented to be calibratable and monitorable during measuring operation.

Another advantage of the inventive magnetic field sensor and method is that the magnetic field sensor can be calibrated during operation and thus additional hardware cost or time effort can be saved. Exemplarily, the measuring results can be combined and/or evaluated by a micro controller or processor such that additional effort is limited to only one additional calculation operation. The measuring field components and the calibration field components may thus be made available at the same time and in a compensated manner. This is of particular advantage in safety-critical cases of application, such as, for example, in automobile or medical engineering, since the magnetic field sensor can be calibrated and/or adjusted continuously and at the same time its functionality can be monitored, without having to put up with compromises as to quality or quantity of a measurement in many cases.

BRIEF DESCRIPTION OF THE DRAWINGS

Embodiments of the invention will be detailed subsequently referring to the appended drawings, in which.

DETAILED DESCRIPTION OF THE INVENTION

Figure 1A:
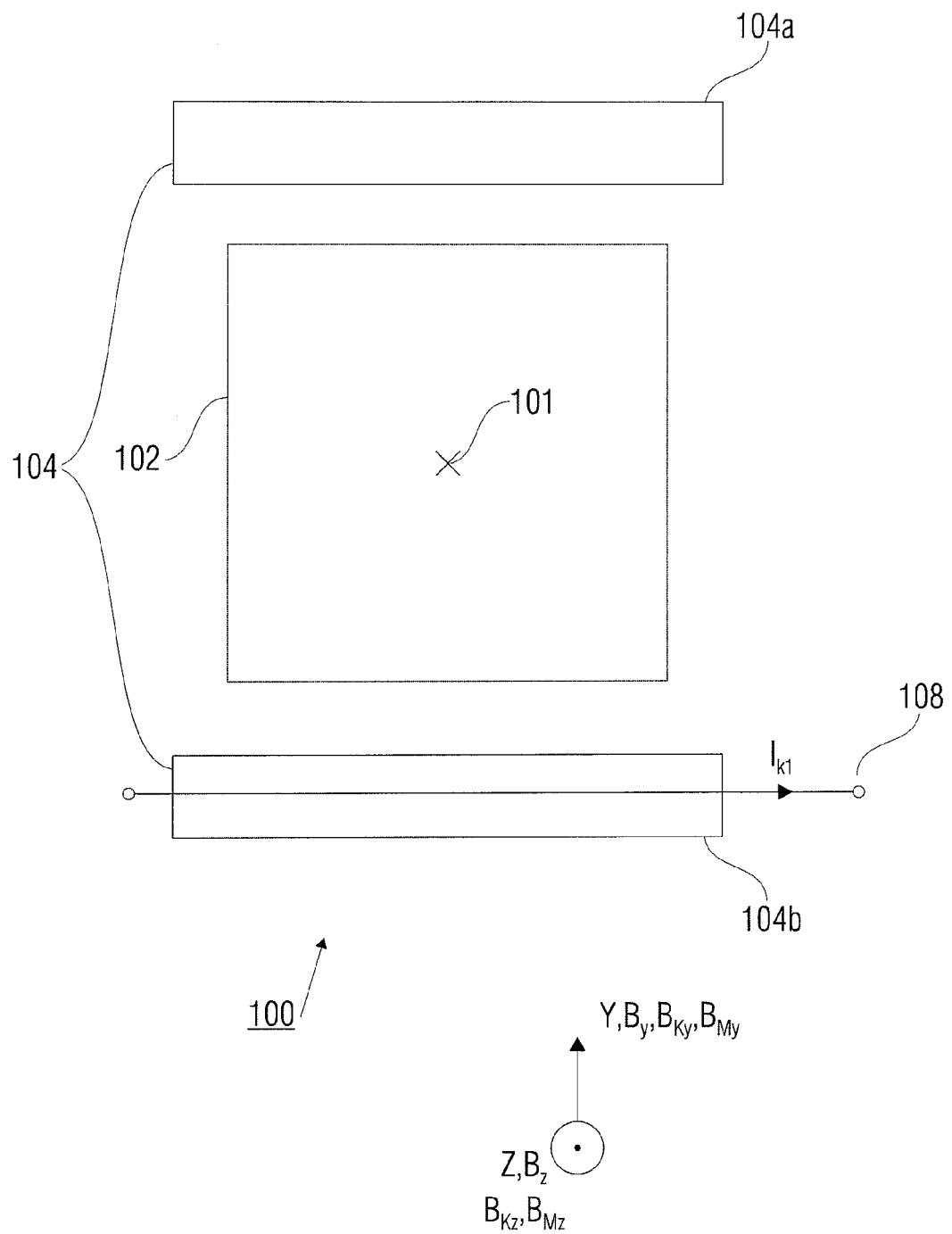
FIG. 1a shows a basic arrangement of Hall sensor elements and an excitation line in accordance with an embodiment of the magnetic field sensor, calibratable during measuring operation, for detecting first and second spatial magnetic field components in accordance with the present invention.

With reference to the following specifications it should be noted, that in the different embodiments same or seemingly same functional elements have the same reference numerals and are thus mutually interchangeable in the different embodiments illustrated in the following.

FIG. 1a shows a calibratable magnet field sensor 100 for detecting a first and a second spatial component ($B_y$, $B_z$) of a magnet field in a reference point 101, wherein the magnetic field comprises and first and second measurement field component ($B_{My}$, $B_{Mz}$) and/or a first and second calibration field component ($B_{Ky}$, $B_{Kz}$). The magnetic field sensor 100 includes a first sensor element arrangement 104 comprising at least a first and a second sensor element (1041a, 104b) for detecting the first magnetic field component $B_y$ comprising a first measurement field component $B_{My}$ and/or a first calibration field component $B_{Ky}$, with reference to a first spatial axis y in the reference point 101.

Further, the magnetic field sensor 100 includes a second sensor element arrangement 102 for detecting the second magnetic field component $B_z$ comprising a second measurement field component $B_{Mz}$ and/or a second calibration field component $B_{Kz}$, with reference to a second spatial axis z in the reference point 101. The magnetic field sensor 100 further includes an excitation line 108 which is arranged with respect to the first sensor element arrangement 104 such that with an impression of a predetermined current $I_{k1}$ into the excitation line 108 a pair of different predetermined calibration field components $B_{Kya}$ in the first sensor element 104a and $B_{Kyb}$ in the second sensor element 104b with reference to the first spatial axis y is generated in the first sensor element arrangement 104, wherein the two spatial axes y and z pass along linearly independent position vectors.

Figure 1B:
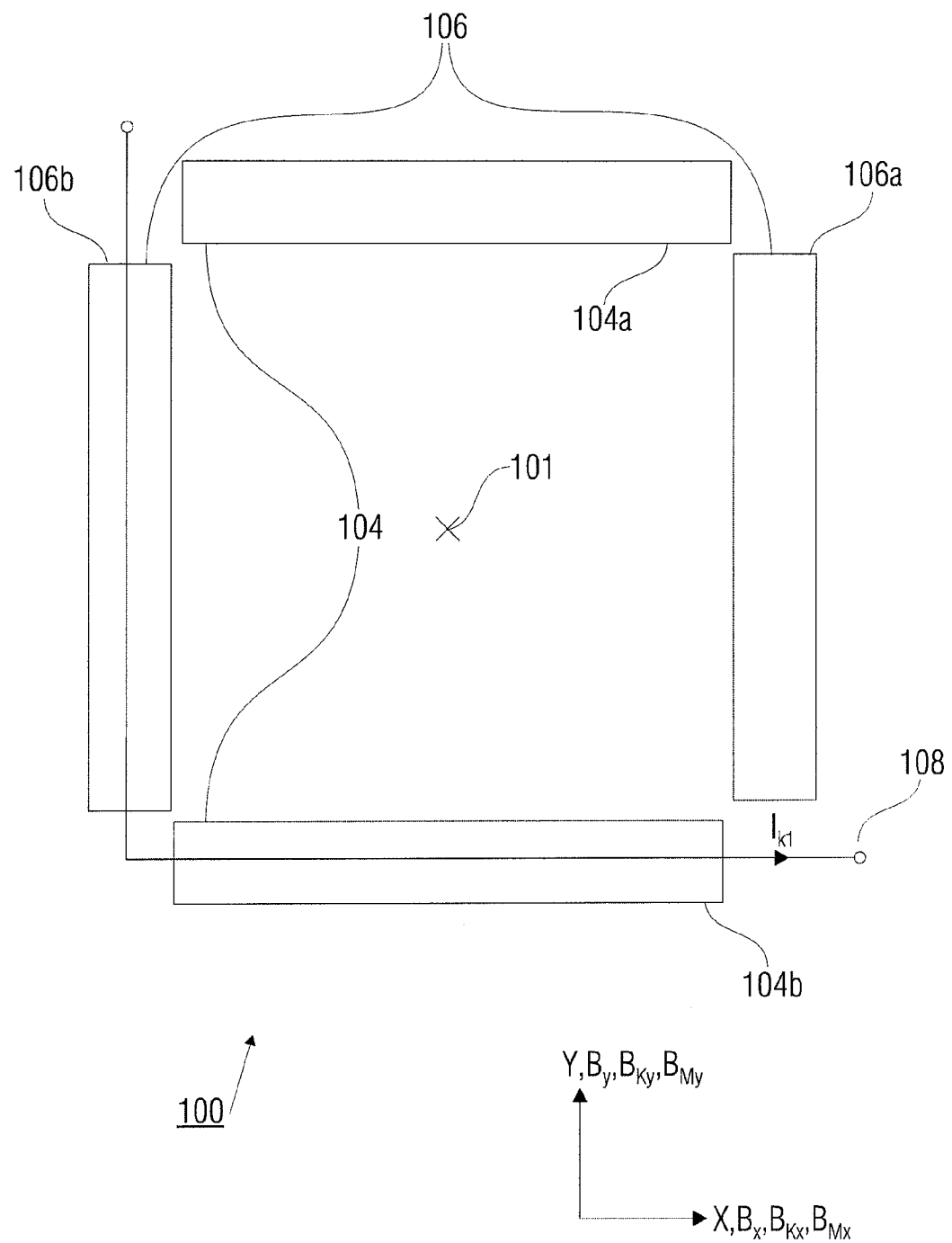
FIG. 1b shows another basic arrangement of Hall sensor elements and an excitation line in accordance with an embodiment of the magnetic field sensor, calibratable during measuring operation, for detecting first and second spatial magnetic field components in accordance with the present invention.

FIG. 1b shows a further embodiment of a calibratable magnetic field sensor 100 for detecting a first and a second spatial component ($B_x$, $B_y$) of a magnetic field in a reference point 101, wherein the magnetic field comprises a first and a second magnetic field component ($B_{Mx}$, $B_{My}$) and/or a first and a second calibration field component ($B_{Kx}$, $B_{Ky}$). The magnetic field sensor 100 includes a first sensor element arrangement 106 comprising at least a first and a second sensor element 106a and 106b for detecting the first magnetic field component $B_x$ comprising a first measurement field component $B_{Mx}$ and/or a first calibration field component $B_{Kx}$, with reference to the first spatial axis x in the reference point 101.

The magnetic field sensor illustrated in FIG. 1b further includes a second sensor element arrangement 104 for detecting the second magnetic field component $B_y$ comprising a second measurement field component $B_{My}$ and/or a second calibration field component $B_{Ky}$, with reference to a second spatial axis y in the reference point 101.

In the embodiment of FIG. 1b, the magnetic field sensor 100 further comprises an excitation line 108 which is arranged with respect to the first sensor element arrangement 106 so that with an impression of a predetermined current $I_{K1}$ in the excitation line 108 a pair of different, predetermined calibration field components $B_{Kxa}$ in the first sensor element 106a and $B_{Kxb}$ in the second sensor element 106b with reference to the first spatial axis x is generated in the first sensor element arrangement 106, wherein the two spatial axes x and y pass along independent position vectors. In a further embodiment, the sensor elements may be arranged so that they relate to the two spatial axis x and z, wherein a such an embodiment the first sensor element arrangement would correspond to the sensor element arrangement 106 of FIG. 1b, and the second sensor element arrangement would correspond to the sensor element arrangement 102 of FIG. 1a. In the general case, inventive embodiments may be detect magnetic fields according to two spatial directions passing along linearly independent position vectors, wherein the excitation line 108 is here arranged so that it may generate calibration field components which are different at least with regard to a sensor element arrangement of the magnetic field sensor comprising at least two sensor elements. Here, the directions of the linearly independent position vectors are not fixed so that two random spatial directions may be realised.

According to the embodiment illustrated in FIG. 1b, the calibratable magnetic field sensor 100 may include a second sensor element arrangement 104 also comprising at least a first 104a and a second sensor element 104b and wherein the excitation line is further arranged with respect to the second sensor element arrangement 104 so that a second pair of different predetermined calibration field components $B_{kya}$ in the first sensor element 104a and $B_{Kyb}$ in the second sensor element 104b with reference to the second spatial axis y is generated in the second sensor element arrangement 104.

Figure 1C:
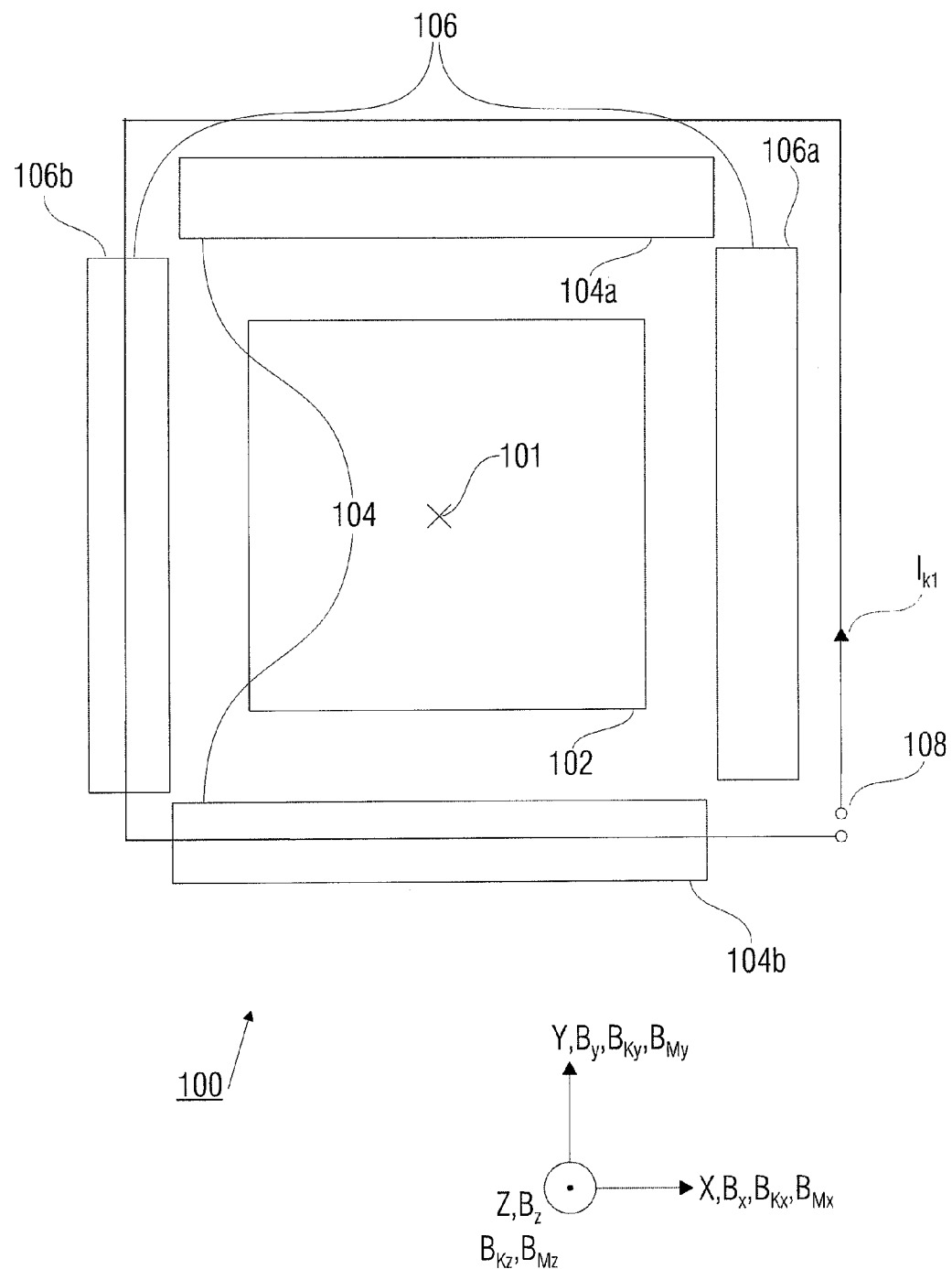
FIG. 1c shows a basic arrangement of Hall sensor elements and an excitation line in accordance with an embodiment of the magnetic field sensor, calibratable during measuring operation, for detecting first, second and third spatial magnetic field components in accordance with the present invention.

Apart from the magnetic field sensors described with reference to FIGS. 1a and 1b, for detecting at least two spatial dimensions, in embodiments also three spatial directions may be detected. FIG. 1c shows an embodiment of a calibratable magnetic field sensor 100 which is further implemented to detect a third spatial component $B_x$ or $B_z$ of the magnetic field in the reference point 100, wherein the magnetic field comprises a third measurement field component $B_{Mx}$ or $B_{Mz}$ and/or a third calibration field component $B_{Kx}$ or $B_{Kz}$.

With reference to FIG. 1a, by the embodiment of the magnetic field sensor which is illustrated in FIG. 1c additionally a spatial magnetic component $B_x$ is detected, with reference to FIG. 1b the embodiment of the magnetic field sensor of FIG. 1c additionally detects the spatial magnetic component B.

The embodiment of the magnetic field sensor 100 of FIG. 1c further includes a third sensor element arrangement 106 or 102 for detecting the third magnetic field component $B_x$ or $B_z$ comprising the third measurement field component $B_{Mx}$ or $B_z$ and/or the third calibration field component $B_{Kx}$ or $B_{Kz}$, with reference to a third spatial axis x or z in the reference point 101, wherein the three spatial axes z, y and x pass along linearly independent position vectors.

Figure 1D:
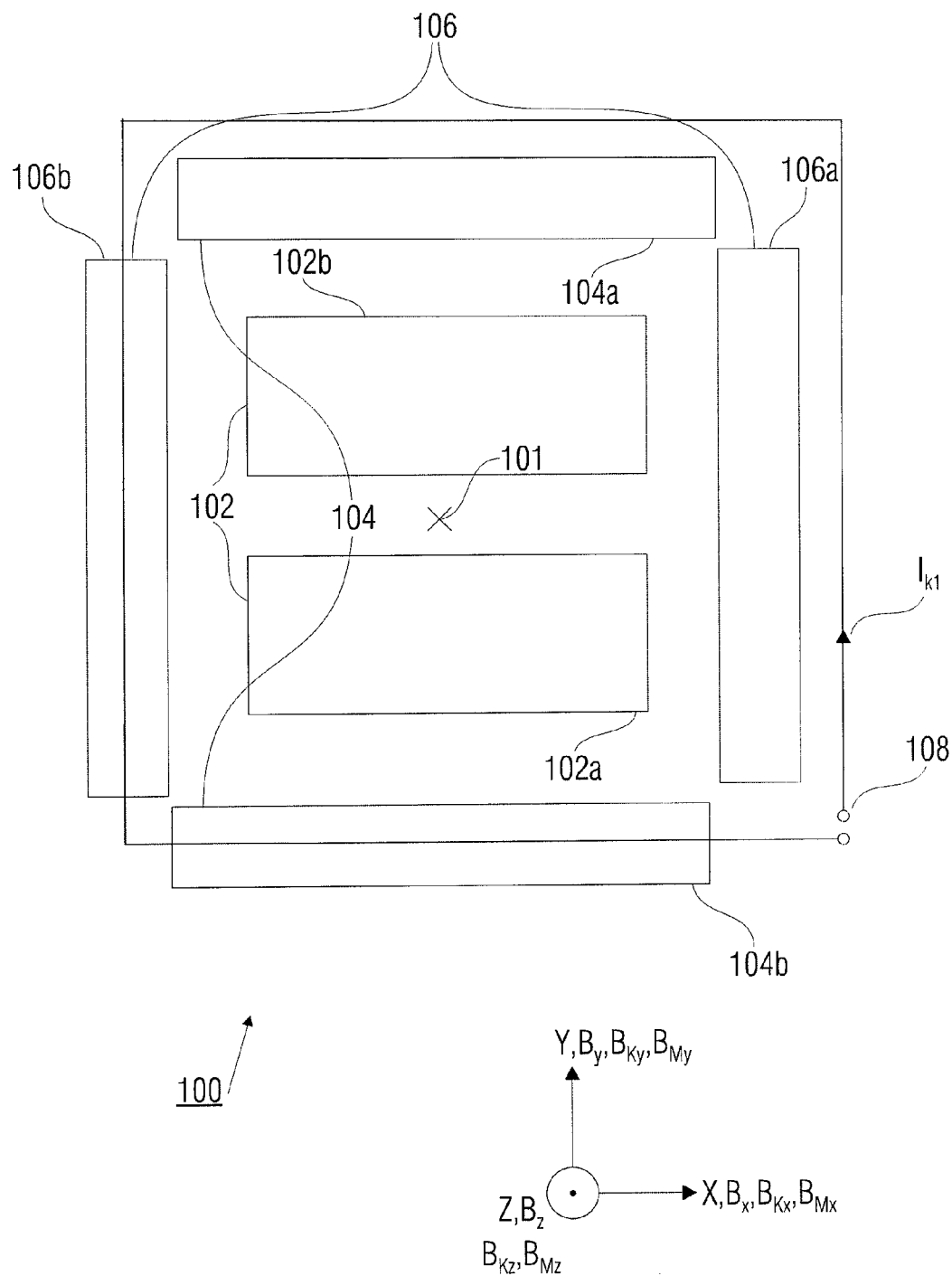
FIG. 1d shows another basic arrangement of Hall sensor elements and an excitation line in accordance with an embodiment of the magnetic field sensor, calibratable during measuring operation, for detecting first, second and third spatial magnetic field components in accordance with the present invention.

A further embodiment of a magnetic field sensor 100 is illustrated in FIG. 1d. In the embodiment of FIG. 1d, the third sensor element arrangement 102 also includes a first and a second sensor element 102a and 102b, wherein the excitation line 108 is arranged with regard to the third sensor element arrangement 102 so that with an impression of a predetermined current $I_{k1}$ into the excitation line 108 a pair of different predetermined calibration field components $B_{Kza}$ and $B_{Kzb}$ in the first sensor element 102a and in the second sensor element 102b with respect to the first spatial axis z is generated in the third sensor element arrangement.

Generally, embodiments include calibratable magnetic field sensors for detecting two or three spatial magnetic field components. FIGS. 1a to 1d here show different variants, wherein the individual spatial directions are interchangeable here. Thus, for example, to a magnetic field sensor according to FIG. 1a, a third sensor element arrangement 106 according to FIG. 1c may be added.

In the following, embodiments of the present invention are explained in detail. In order to avoid repetitions, in the following embodiments it is assumed that the respective magnetic field sensors detect a magnetic field towards three spatial directions, wherein the three spatial directions pass along linearly independent position vectors. Generally, however, all embodiments described in the following are also possible for only detecting two spatial directions of magnetic fields. Thus, in the embodiments explained in the following, one sensor element arrangement 102, 104 or 106 each may be omitted. The explained concept then unrestrictedly also apply to the remaining two sensor element arrangements for detecting a magnetic field along two linearly independent spatial directions and/or the following embodiments may be applied, with respect to the sensor elements and their implementations, equally also to the embodiments of FIGS. 1a and 1b.

FIG. 1d shows an embodiment of a magnetic field sensor 100 calibratable in the measurement operation for detecting a first, second and third spatial component $B_z$, $B_y$ and $B_x$ of a magnetic field in a reference point 101, wherein the magnetic field comprises a first, second and third measurement field component $B_{Mz}$, $B_{My}$, $B_{Mz}$ and/or a first, second and third calibration field component $B_{Kz}$, $B_{Ky}$ and $B_{Kx}$.

The magnetic field sensor 100 includes a first sensor element arrangement 102 comprising at least two sensor elements 102a and 102b for detecting the first magnetic field component $B_z$ comprising a first measurement field component $B_{Mz}$ and/or a first calibration field component $B_{Kz}$, with reference to a first spatial axis z in the reference point 101. The magnetic field sensor 100 further includes a second sensor element arrangement 104 comprising at least two sensor elements 104a and 104b for detecting the second magnetic field component $B_y$ comprising a second measurement field component $B_{My}$ and/or a second calibration field component $B_{Ky}$, with reference to a second spatial axis y in the reference point 101. The magnetic field sensor 100 also includes a third sensor element arrangement 106 comprising at least two sensor elements 106a and 106b for detecting the third magnetic field component $B_x$ comprising a third measurement field component $B_{Mx}$ and/or a third calibration field component $B_{Kx}$ with respect to a third spatial axis x in the reference point 101.

The magnetic field sensor 100 further includes an excitation line 108 which is arranged with respect to the first 102, second 104 and third sensor element arrangement 106 so that with an impression of a predetermined current $I_{k1}$ into the excitation line 108, a first pair of different predetermined calibration field components $B_{Kza}$ in the sensor element 102a and $B_{Kzb}$ in the sensor element 102b of the first spatial axis z is generated in the first sensor element arrangement 102, a second pair of different predetermined calibration field components $B_{Kya}$ in the sensor element 104a and $B_{Kyb}$ in the sensor element 104b with respect to the second spatial axis y is generated in the second sensor element arrangement 104, and a third pair of different predetermined calibration field components $B_{Kza}$ in the sensor element 106a and $B_{Kzb}$ in the sensor element 106b with respect to the first spatial axis x is generated in the third sensor element arrangement 106, wherein the three spatial axes z, y and x pass along linearly independent position vectors.

FIG. 1d shows an embodiment of a magnetic field sensor 100 comprising an asymmetrically arranged excitation line 108. The pairs of different, predetermined calibration field components with respect to the at least two sensor elements each (e.g., 102a, 102b; 104a, 104b; 106a, 106b) of a sensor element arrangement (e.g., 102, 104, 106) are here achieved by the asymmetry of the excitation line with respect to the reference point 101. The excitation line 108 may here be arranged such according to the embodiment of FIG. 1d, that it forms a coil with at least one winding.

Geometrically seen, the excitation line 108 may be arranged in embodiments such that the coil with the at least one winding comprises shortest distances to the at least two sensor elements (e.g., 102a, 102b; 104a, 104b; 106a, 106b) of a sensor element arrangement (e.g., 102, 104, 106), which are different. Due to shorter distances of the excitation line 108 to the sensor element arrangements (e.g., 104, 106), when a current flows in the excitation line 108, stronger calibration field components are generated than with greater distances. A shortest distance of the excitation line 108 to a sensor element (e.g., 104a, 104b, 106a, 106b) may here relate to a mean effective distance.

For example, here the sensor elements (e.g., 104a, 104b, 106a, 106b) may be implemented paired symmetrically with regard to the excitation line 108, with reference to the example of FIG. 1d, sensor elements 104a and 106a and/or 104b and 106b. Generally, however, also any "asymmetrical" geometries may be realised in which a defined asymmetry is generated with respect to the calibration field components in the different sensor elements (e.g., 104a, 104b, 106a, 106b) or sensor element arrangements (e.g., 104, 106). The asymmetry may also be accomplished via differently strong excitation currents. The paired symmetrical arrangement allows a simple evaluation, whereas between the sensor elements (e.g., 104 and 104b and/or 106a and 106b) due to different distances a defined asymmetry and thus also a defined asymmetry with respect to the calibration field components that may be generated may exist. This may, for example, according to FIGS. 1a to 1d, be achieved by a geometrical shift or asymmetry of the excitation line 108 with respect to the reference point 101. The excitation line 108 in the embodiments of FIGS. 1c and 1d passes directly above the sensor elements 104b and 106b, however, laterally to the sensor elements 104a and 106a. Insofar, the different shortest distances of the excitation line 108 to the sensor elements (e.g., 104a, 104c; 106a, 106b) of a sensor element arrangement (e.g., 104, 106) may be regarded in such a way that the excitation line 108 shows different distances to two sensor elements each (e.g., 104a and 104b and/or 106a and 106b) of a sensor element arrangement (e.g., 104 and/or 106), so that the magnetic field components caused in the sensor elements (e.g., 104a and 104b and/or 106a and 106b) of a sensor element arrangement (e.g., 104 and/or 106) due to a current $I_{k1}$ in the excitation line 108 are also different.

As already explained above, in the explained embodiments one sensor element arrangement 102, 104 or 106 respectively may also be omitted. The explained concepts then apply unrestrictedly also for the remaining two sensor element arrangements for detecting a magnetic field along two linearly independent spatial directions and/or the explanations with regard to the sensor elements and their implementations equally apply also to the embodiments of FIGS. 1a and 1b.

Figure 2:
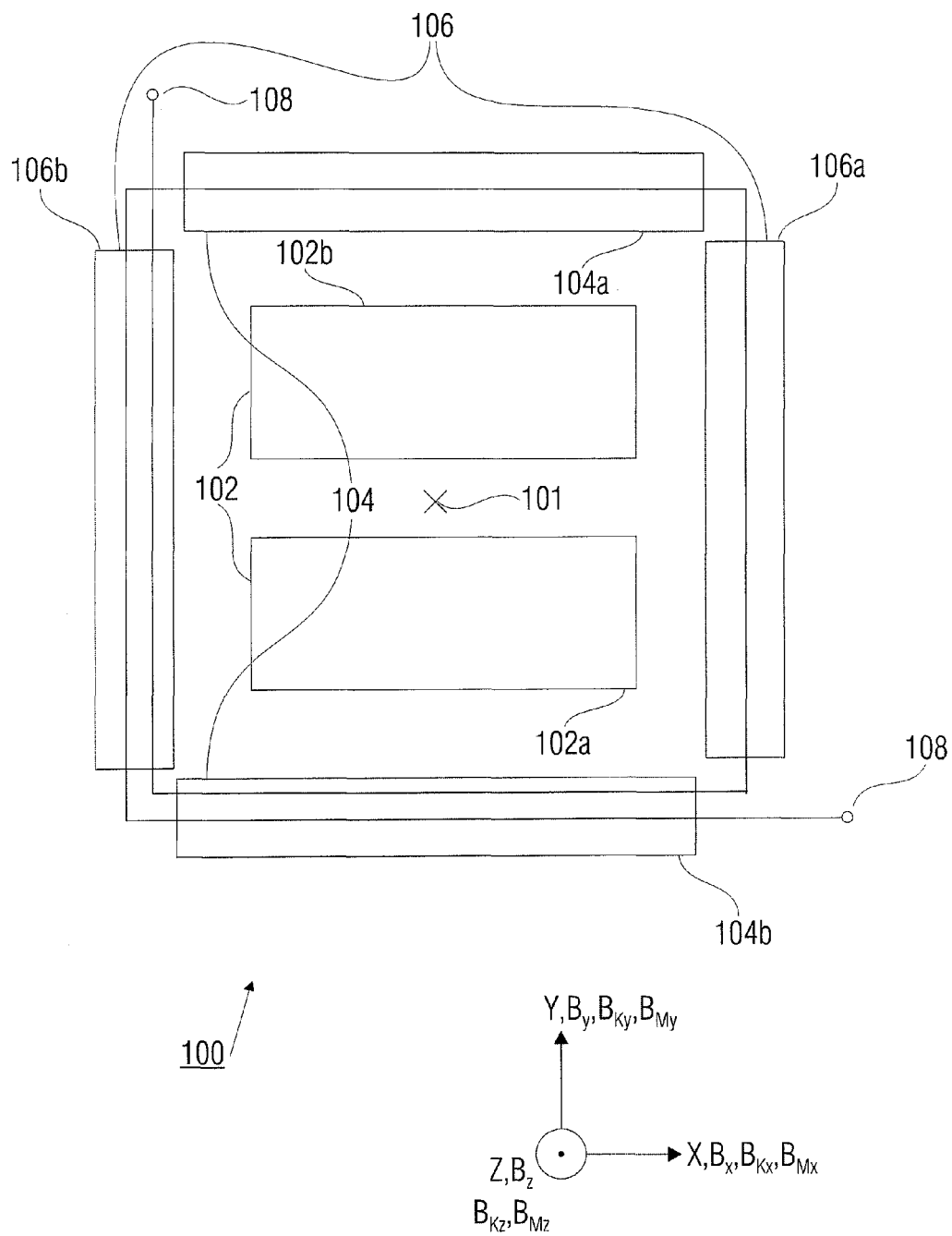
FIG. 2 shows a basic arrangement of Hall sensor elements and an excitation line in accordance with another embodiment of the magnetic field sensor calibratable during measuring operation in accordance with the present invention.

In other embodiments, the excitation line 108 may also be arranged symmetrically with regard to the reference point 101. Such an embodiment is illustrated in FIG. 2. FIG. 2 shows a further embodiment of a magnetic field sensor 100 comprising the same components which were already illustrated and explained with reference to FIG. 1d. The difference to FIG. 1d is now the arrangement of the excitation line 108, which is implemented in FIG. 2 as a coil with 1.5 windings. Generally, in embodiments coil implementations with any number of windings are possible, the already mentioned asymmetry may, however, also be achieved by incomplete windings and/or partial windings, as it is illustrated schematically in FIG. 2. Generally, here also one individual partial winding would be possible, see FIG. 1a and 1b. In these cases, a partial winding may thus also be realized by a conductive trace according to FIGS. 1a and 1b, which is arranged asymmetrically with respect to the sensor elements of a sensor element arrangement.

Embodiments may also comprise excitation lines 108, which are not implemented symmetrically with respect to the reference point 101 and comprise a non-integer number of windings. Accordingly, the excitation line 108 may be implemented such that it comprises one complete winding and one partial winding. Also here, a paired symmetrical arrangement of the excitation line 108 is possible with respect to the sensor elements (e.g. 104a, 104b, 106a, 106b), wherein the general case is not restricted to this symmetry and in embodiments any arrangements may occur, which may generate defined "asymmetrical" calibration field components.

As already explained above, in the mentioned embodiments also one sensor arrangement each 102, 104, or 106 may be omitted. The explained concepts then also apply unrestrictedly to the remaining two sensor element arrangements for detecting a magnetic field along two linearly independent spatial directions and/or the embodiments with respect to the sensor elements and their implementations are each equally applicable also to the embodiments of FIGS. 1a and 1b.

Figure 3A:
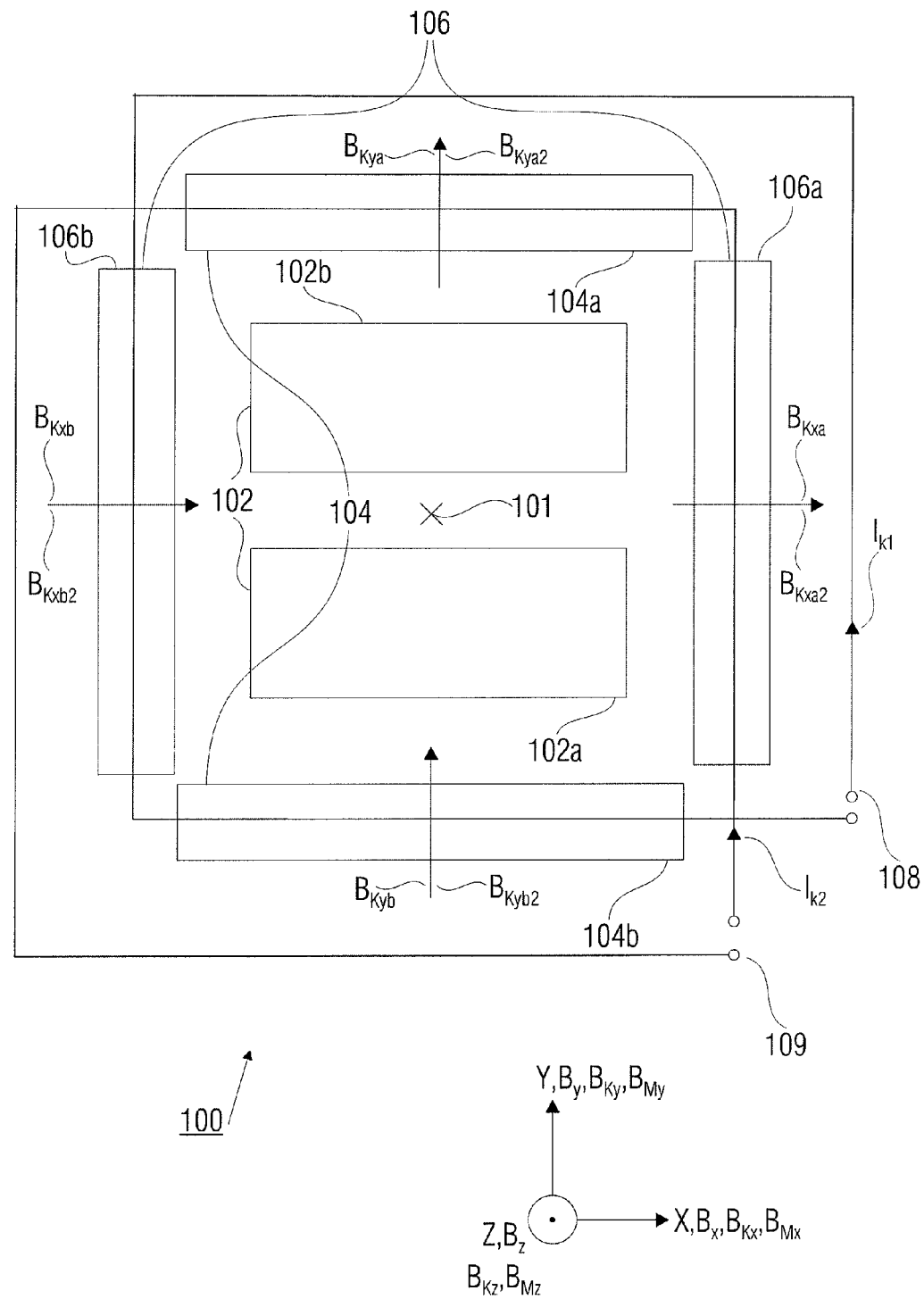
FIG. 3a shows a basic arrangement of Hall sensor elements and an excitation line in accordance with another embodiment of the magnetic field sensor calibratable during measuring operation in accordance with the present invention.

A further embodiment of a magnetic field sensor 100 is illustrated in FIG. 3a. The magnetic field sensor 100 of FIG. 3a comprises the same components as those which were illustrated and explained with reference to FIG. 1a to d and 2. Additionally, in the embodiment of FIG. 3a a second excitation line 109 exists. According to FIG. 3a, the second excitation line 109 is shifted with respect to the excitation line 108, i.e. the excitation line 108 passes directly above the sensor elements 104b and 106b, however, laterally to the sensor elements 104a and 106a. The second excitation line 109 passes directly above the sensor elements 104a and 106a, however, laterally to the sensor elements 104b and 106b.

Also here, in the explained embodiments, one sensor element arrangement 102, 104 or 106 may each also be omitted. The explained concepts then unrestrictedly also apply to the remaining two sensor element arrangements for detecting a magnetic field along two linearly independent spatial directions and/or the explanations with respect to the sensor elements and their implementations are each equally applicable also to the embodiments of FIGS. 1a and 1b.

In embodiments, the second excitation line 109 may be arranged with regard to the first 102, second 104 and third sensor element arrangement 106, so that with an impression of a further predetermined current $I_{k2}$ into the second excitation line 109, a first further pair of different predetermined calibration field components $B_{Kza2}$ in the sensor element 102a and $B_{Kzb2}$ in the sensor element 102b is generated with respect to the first spatial axis z in the first sensor element arrangement 102, a second further pair of different predetermined calibration field components $B_{Kya2}$ in the sensor element 104a and $B_{Kyb2}$ in the sensor element 104b with respect to the second spatial axis y is generated in the second sensor element arrangement 104, and a third pair of different predetermined calibration field components $B_{Kxa2}$ in the sensor element 106a and $B_{Kxb2}$ in the sensor element 106b with respect to the third spatial axis x is generated in the third sensor element arrangement 106.

According to FIG. 3a, via the second excitation line also additional calibration field components may be generated. Also here, a paired symmetrical arrangement of the second excitation line 109 is possible with respect to the sensor elements (e.g. 104a, 104b, 106a, 106b), wherein the general case is not limited to this symmetry and in embodiments any arrangements may occur, which may generate defined calibration field components.

Here, in embodiments, the first excitation line 108 and the second excitation line 109 may be arranged such that the first further pair of different predetermined calibration field components is in a reversed relation to each other compared to the first pair of calibration field components, that the second further pair of different predetermined calibration field components is in a reversed relation to each other compared to the second pair of calibration field components and that the third further pair of different predetermined calibration field components is in a reversed relation to each other compared to the third pair of calibration field components. This is illustrated in FIG. 3a as an example by the geometry of the first 108 and second excitation line 109.

As an example, a current flows through the first excitation line 108, while no current flows through the second excitation line. Accordingly, the first excitation line 108 in the sensor elements 104b and 106b generates strong calibration field components $B_{Kyb}$ and $B_{Kxb}$, and weak calibration field components $B_{Kya}$ and $B_{Kxa}$ in the sensor elements 104a and 106a. If the energization and/or current flow is reversed, so that the first excitation line 108 is current-less and the second excitation line carries the current $I_{k2}$, which previously has flown in the first excitation line, then the second excitation line 108 generates weak calibration field components $B_{Kyb2}$ and $B_{Kxb2}$ in the sensor elements 104b and 106b and strong calibration field components $B_{Kya2}$ and $B_{Kxa2}$ in the sensor elements 104a and 106a. In embodiments, the excitation lines 108 and 109 may be arranged so that the following may apply in such an example $$B_{Kyb}/B_{Kya} = B_{Kxb}/B_{Kxa},$$

$$B_{Kyb2}/B_{Kya2} = B_{Kxb2}/B_{Kxa2},$$

or $$B_{Kyb}/B_{Kya} = B_{Kxa2}/B_{Kxb2}.$$

In embodiments, the first sensor element arrangement 102 may comprise a horizontal Hall sensor element 102a or 102b with respect to a main surface of the magnetic field sensor. Generally, in embodiments any magnetic field sensors may be used which comprise corresponding sensitivities for the different magnetic field components ($B_x$, $B_y$, $B_z$). For example, also the use of magneto-resistive sensor elements is possible. In the following, embodiments of the present invention are described as an example by realizations of Hall sensor elements. The first sensor element arrangement 102 may further comprise a plurality of Hall sensor elements horizontal with regard to a main surface of the magnetic field sensor, wherein the geometric arrangement of the plurality of horizontal Hall sensor elements (e.g. 102a; 102b) may be symmetrical in pairs with respect to the reference point 101, and the Hall sensor elements are coupled to each other such that the magnetic field component may be detectable in an offset-compensated way.

In embodiments, the second sensor element arrangement 104 may comprise two Hall sensor elements (e.g. 104a; 104b) vertical with respect to a main surface of the magnetic field sensor, wherein the geometrical arrangement of the at least two vertical Hall sensor elements may be symmetrical in pairs with respect to the reference point 101, and the sensor elements may be coupled to each other such that the magnetic field component becomes detectable in an offset-compensated way. Generally, in embodiments also here any magnetic field sensors may be used which comprise a corresponding sensitivity for the different magnetic field components ($B_x$, $B_y$, $B_z$).

In embodiments, the third sensor element arrangement 106 may comprise at least two Hall sensor elements (e.g. 106a; 106b) vertical with respect to a main surface of the magnetic field sensor, wherein the geometrical arrangement of the at least two vertical Hall sensor elements may be symmetrical in pairs with respect to the reference point 101, and the same are coupled to each other such that the magnetic field component is detected in an offset compensated way. In further embodiments, the first 102, second 104 or third sensor element arrangement 106 may also be operable in the spinning current mode. Generally, in embodiments also here any magnetic field sensors may be used.

Figure 3B:
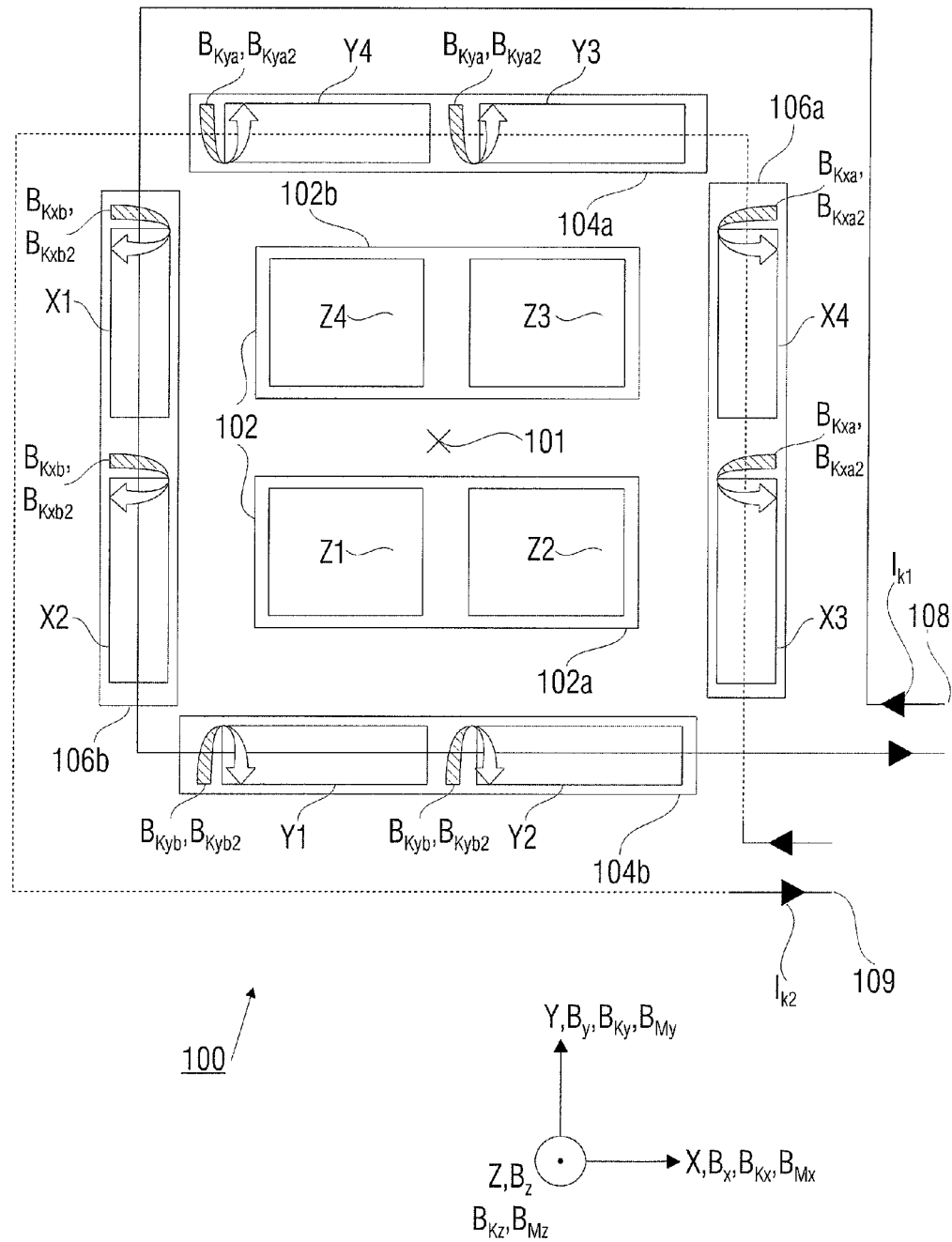
FIG. 3b shows a basic arrangement of Hall sensor elements and an excitation line in accordance with another embodiment of the magnetic field sensor calibratable during measuring operation in accordance with the present invention.

A further embodiment is illustrated in FIG. 3b. As already explained above, in the explained embodiments, one sensor element arrangement 102, 104 or 106 each may also be omitted. The explained concepts then unrestrictedly also apply to the remaining two sensor element arrangements for detecting a magnetic field along two linearly independent spatial directions and/or the embodiments with respect to the sensor elements and their implementations are equally applicable also to the embodiments of FIGS. 1a and 1b.

The magnetic field sensor 100 of FIG. 3b comprises the same components as those which were illustrated and explained with reference to FIGS. 1, 2 and 3a. In the embodiment of FIG. 3b, also a second excitation line 109 exists which is implemented as a dashed line. According to FIG. 3b, the second excitation line 109 is shifted with respect to the excitation line 108, i.e. the excitation line 108 passes directly above the sensor elements 104b and 106b, however laterally to the sensor elements 104a and 106a. The second excitation line 109 passes directly above the sensor elements 104a and 106a, however laterally to the sensor elements 104b and 106b. In FIG. 3b, the sensor elements (e.g. 102a, 102b, 104a, 104b, 106a, 106b) are combined from two individual sensors each, which are designated according to their measurement alignment.

As an example, it is assumed in FIG. 3b, that the sensor element arrangement 102 includes two sensor elements 102a and 102b, wherein the sensor element 102a comprises two individual sensors Z1 and Z2 and the sensor element 102b comprises two individual sensors Z3 and Z4. According to the schematically illustrated coordinate cross in the top right corner of FIG. 3b, the sensor element arrangement 102 is arranged such that magnetic field components may be detected in the z-direction. For example, the individual sensors Z1-Z4 may be realized by horizontal Hall sensors. Analogously, in FIG. 3b the sensor elements arrangement 104 consists of the sensor elements 104a and 104b, which again include the individual sensors Y1-Y4 for detecting magnetic field components in the y-direction. For detecting magnetic field components in the x-direction, the sensor element arrangement 106 is accordingly aligned with the sensor elements 106a and 106b and the individual sensors X1-X4. The individual sensors X1-X4 and Y1-X4 may, for example, also be realized by vertical Hall sensors.

In embodiments, the magnetic field sensors may be excited by only one coil and/or excitation line 108. In the following, thus, the second excitation line 109 and/or coil is disregarded and is explained in more detail in further embodiments, which are regarded later. In the case that only one excitation line 108 and/or a coil exists, the sensor element arrangement 102, which, for example, detects the magnetic field in the z-direction, may be excited with a magnetic field, which is then of only half the size like e.g. when using two coils. In the sensor element arrangements 104 and 106, for example, detecting magnetic fields of the x-direction and the y-direction, the excitation works in a different way.

The sensor element arrangement 104 and 106 may consist of four partial sensors each, as it is, for example, illustrated in FIG. 3b. In this embodiment, two partial sensors each detect the complete field of a coil (e.g. X1, X2, Y1, Y2), the respectively other ones (e.g. X3, X4, Y3, Y4) only detect the substantially weaker approximately also vanishing stray field pointing into the other direction. By a corresponding connection (e.g. parallel connection) of the partial sensors (e.g. X1-X4, Y1-Y4), an averaging of the output signals of the partial sensors results. Two partial sensors in this embodiment each show the complete signal (e.g. X1, X2, Y1, Y2), the respective other two partial sensors (e.g. X3, X4, Y3, Y4) detect virtually no signal. This means that in summation in this embodiment an output signal with comparatively half the intensity is generated.

In this embodiment, the sensor elements arrangement 104 and 106 consequently detect, in comparison with an embodiment having two excitation lines, half the signal by exciting half the partial sensors (e.g. X1, X2, Y1, Y2) with the full magnetic field. The sensor element arrangement 102, which in this embodiment detects the magnetic field in the z-direction, compared to an embodiment with two excitation lines, detects half the signal by an equal excitation of all partial sensors with half the field, as only one coil is used.

In comparison with embodiments having two excitation lines, then half the signal hub results, i.e. also half the signal/noise ratio. For achieving the same quality as with an excitation with two excitation lines, thus a filtering of the measurement and/or a longer measurement may be executed. Further, in the sensor elements arrangements 104 and 106 (e.g. X and Y sensors) not all partial sensors (e.g. X1-X4, Y1-Y4) are excited. As an example, in the embodiment according to FIG. 3b the individual sensors X3, X4, Y3 and Y4 are not and/or only marginally magnetically excited with only one excitation line 108. Thus, a magnetic test of the sensitivity of those individual sensors seems not possible at first, as the same are of the same setup as the respectively opposite sensor elements, a count-back and/or conclusion from the same may be executed. Based on a symmetrical arrangement of the sensor elements arrangements (e.g. 104, 106) then first of all a break in of a calibration field component to one sensor element each (e.g. 104b) may be executed. Due to the defined calibration field component, this sensor element may then be calibrated. Further, based on the given symmetry and the use of the same sensor elements 104a and 104b, in an analog way for the sensor elements 106a and 106b, a calibration of the sensor element which is not directly excited with the calibration field component may be concluded.

Embodiments with a second excitation line 109 according to FIG. 3b are explained in the following. As already explained above, in the explained embodiments, one sensor element arrangement 102, 104 or 106 may also be omitted. The explained concepts then unrestrictedly also apply to the remaining two sensor element arrangements for detecting a magnetic field along two linearly independent spatial directions and/or implementations with regard to the sensor elements and their implementations are each applicable in the same way also to the embodiments of FIGS. 1a and 1b.

Figure 4:
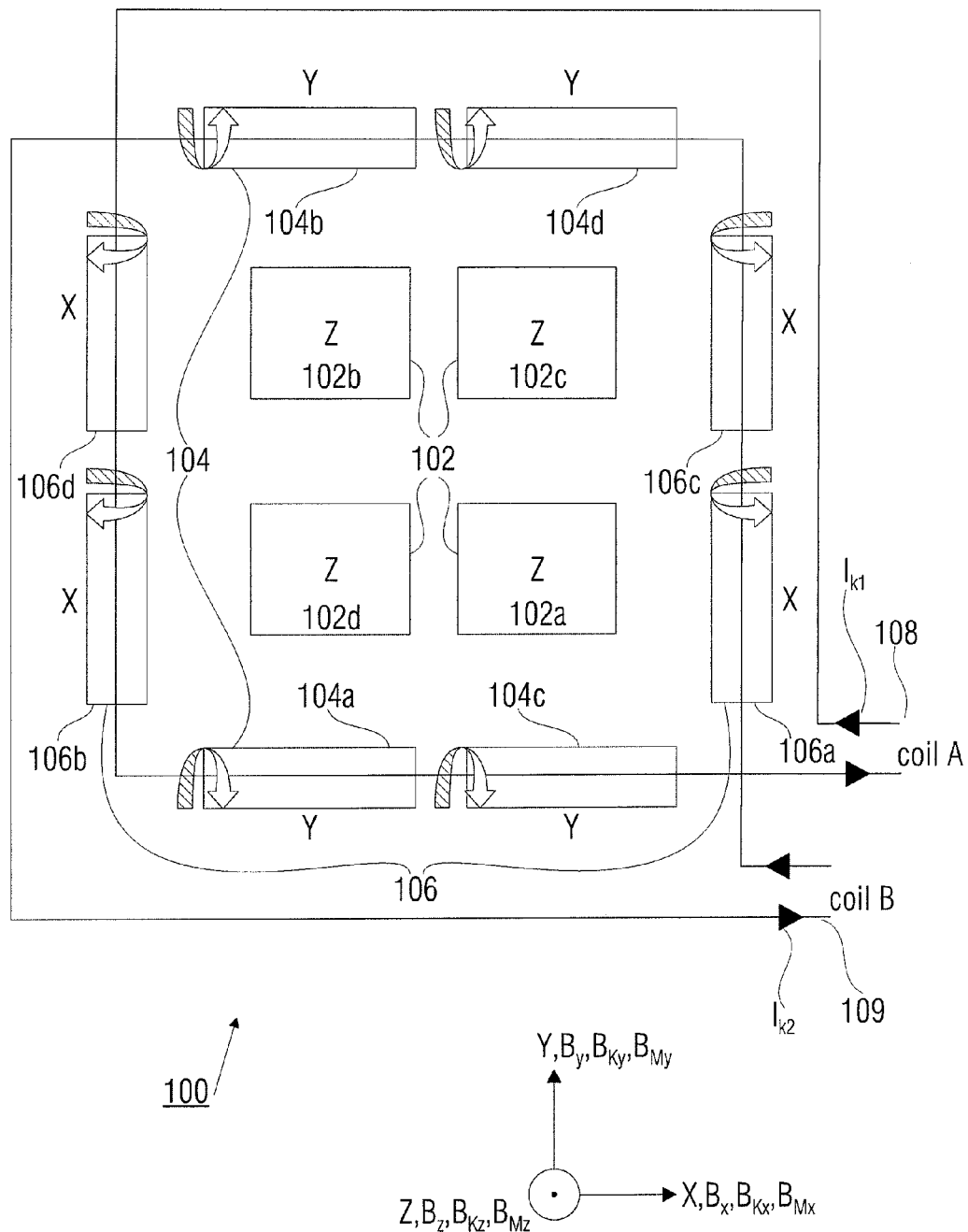
FIG. 4 shows another embodiment of a magnetic field sensor.

In FIG. 4, a further embodiment is illustrated. FIG. 4 shows a first sensor element arrangement 102, which may, for example be realized by four horizontal Hall sensors 102a, 102b, 102c and 102d. Further, FIG. 4 shows a second sensor element arrangement 104, which may be realized by four vertical Hall sensors 104a, 104b, 104c, and 104d. Further, FIG. 4 shows a third sensor element arrangement 106, which may be realized by four vertical Hall sensors 106a, 106b, 106c, 106d. Additionally, in FIG. 4 a first excitation line 108 is illustrated as coil A and a second excitation line 109 as coil B. Here, for example, sensor elements 102a-d, 104a-d or 106a-d of the same sensitivity may be used. As illustrated in FIG. 4, in such an embodiment two excitation lines 108 and 109 may be realized as two coils geometrically shifted with respect to each other.

Embodiments according to FIG. 4 allow for superimposing two magnetic fields of the coils A and B and thus generating a resulting excitation or calibration field in a sensitivity direction. For example, a coil may here be arranged on one side of the arrangement directly above the sensor elements, for example, such as coil A with respect to the sensor elements 104a, 104c, 106b and 106d, and/or the coil B with respect to the sensor elements 104b, 104d, 106a and 106c in FIG. 4. Furthermore, the coils may here pass on another side next to the sensors, such as coil B with respect to the sensor elements 104a, 104c, 106b and 106d, and/or the coil A with respect to the sensor elements 104b, 104d, 106a and 106c in FIG. 4. In embodiments, the coils thus may be placed or arranged so as to be opposite. As already mentioned above, the excitation lines (e.g. 108, 109) or coils may also be arranged symmetrically in pairs with respect to the sensor elements here, but this does not necessarily has to be the case, with arbitrary geometries generally being conceivable, allowing to generate defined different calibration field components within a sensor element arrangement.

If a coil passes directly above vertical sensor elements, its influence thereon is significantly greater than the influence of an adjacent or laterally offset coil, wherein this influence may also be negligible in one embodiment. Thus, the coil A in FIG. 4 mainly excites the vertical sensor elements 104a, 104b, 106b and 106d, and/or the coil B mainly excites the sensor elements 104b, 104d, 106a and 106c. Both coils excite the horizontal sensor elements 102a/d at the center of the arrangement. The following table is to represent, once again, separately for both coils, how the excitation direction behaves depending on the direction of an excitation current, broken down according to the sensor element arrangements 102, 104 and 106. The current arrows in FIG. 4 here each indicate the positive current direction, i.e. a positive current $I_{k1}$ in the coil A at first flows laterally past the sensor elements 106a, 106c, 104d and 104b and then directly above the sensor element 106d, 106b, 104a and 104c, a positive current $I_{k2}$ in the coil B at first flows above the sensor elements 106a, 106c, 104d and 104b and then laterally past the sensor elements 106d, 106b, 104a and 104c.

|  | Excitation Current | Excitation 106 | Excitation 104 | Excitation 102 |
|---|---|---|---|---|
| Coil A, $I_{k1}$ | + | + | + | + |
|  | − | − | − | − |
| Coil B, $I_{k2}$ | + | − | − | + |
|  | − | + | + | − |

Figure 5:
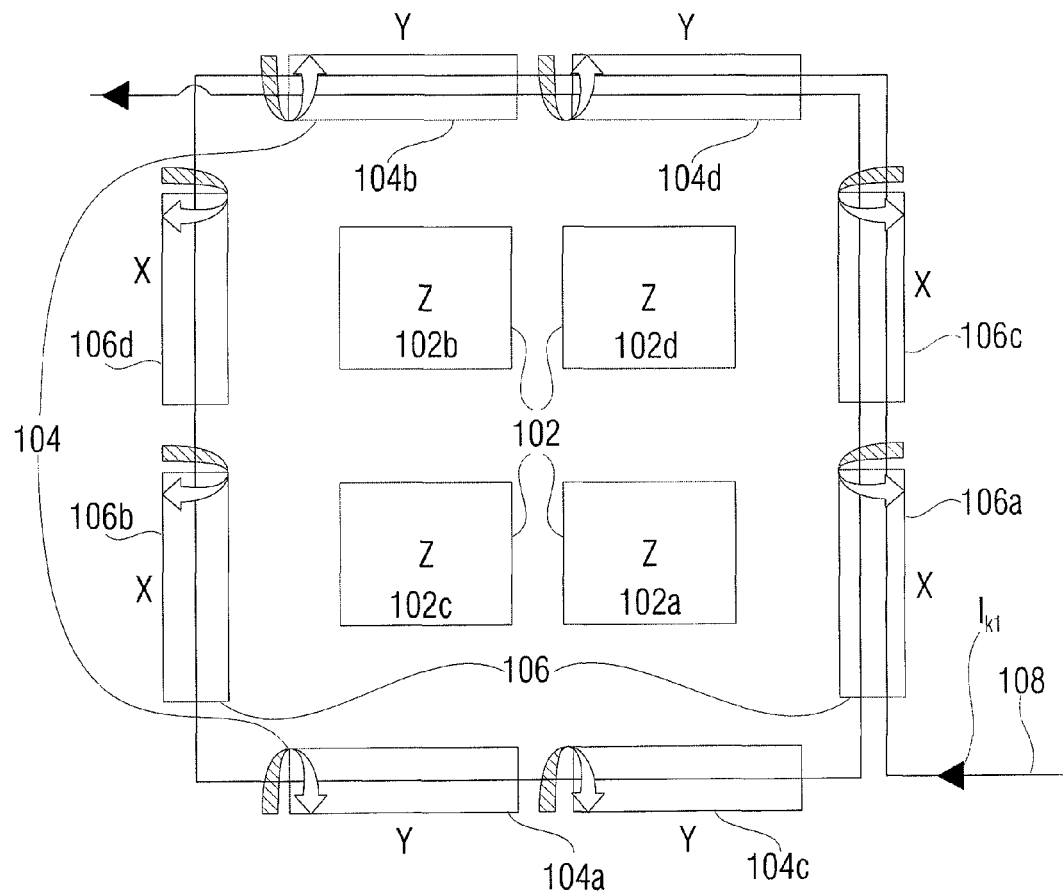
FIG. 5 shows another embodiment of a magnetic field sensor.
Figure 5:
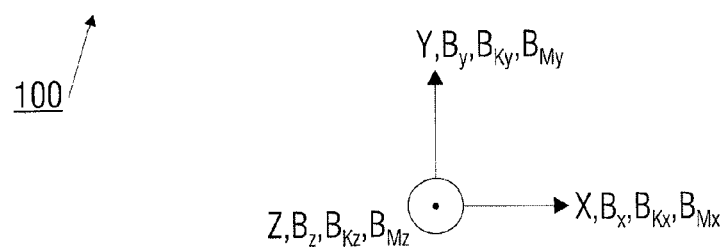
Figure 6A:
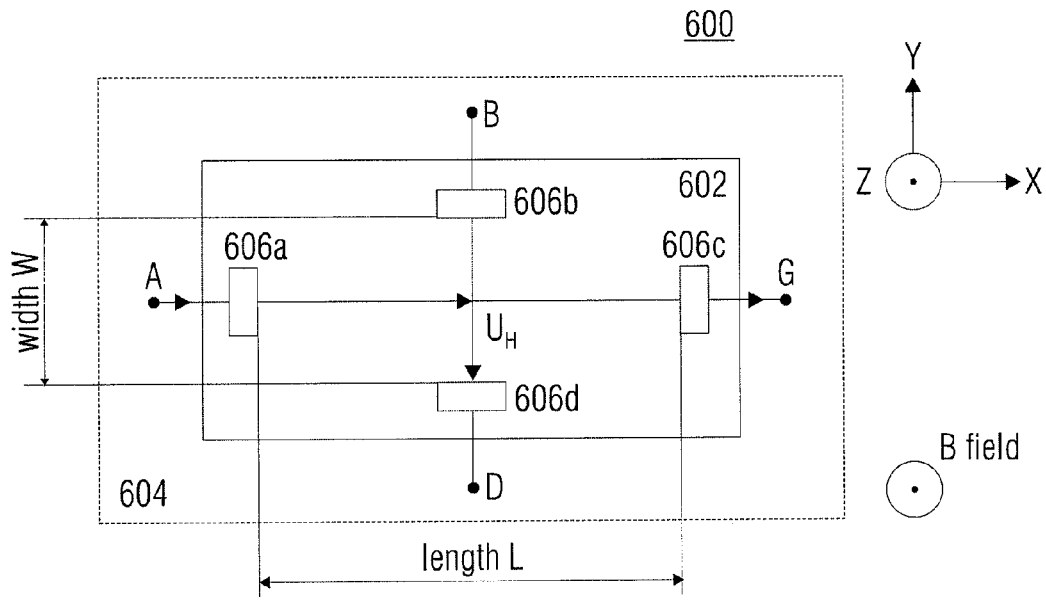
FIG. 6a shows the basic setup of a known horizontal Hall sensor element.
Figure 6B:
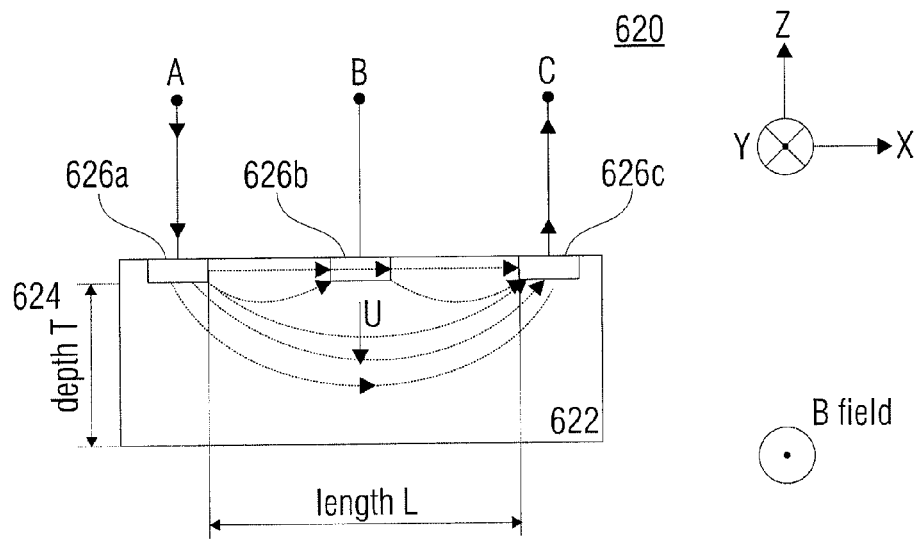
FIG. 6b shows the basic setup of a known vertical Hall sensor element.
Figure 7:
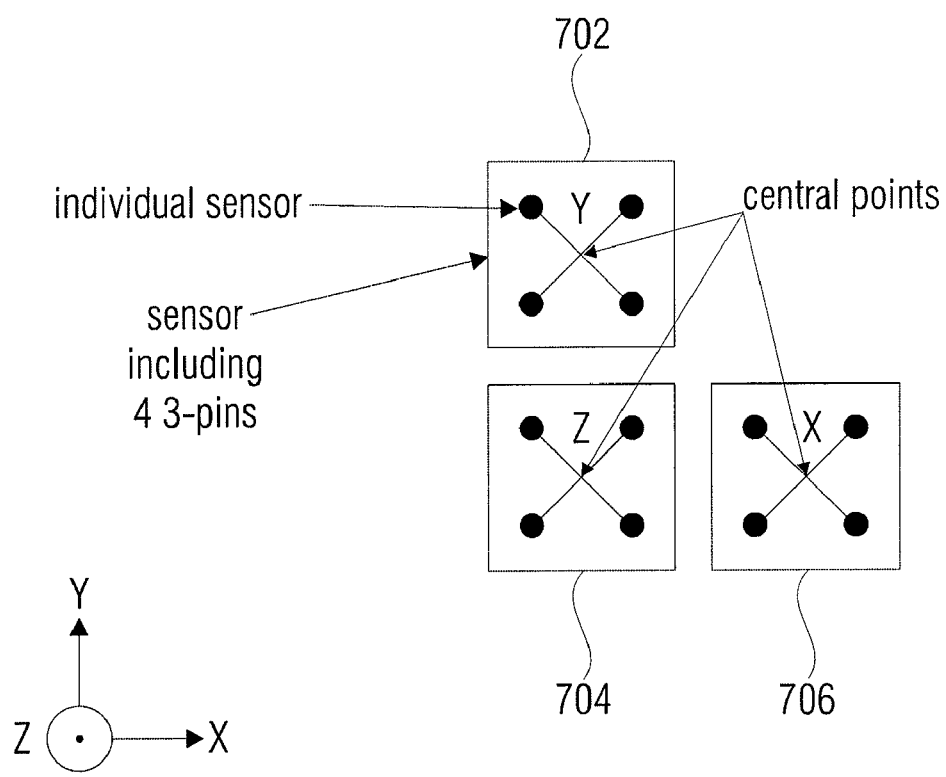
FIG. 7 shows the basic arrangement of individual sensors for spatially detecting magnetic field components in accordance with conventional technology.
Figure 8:
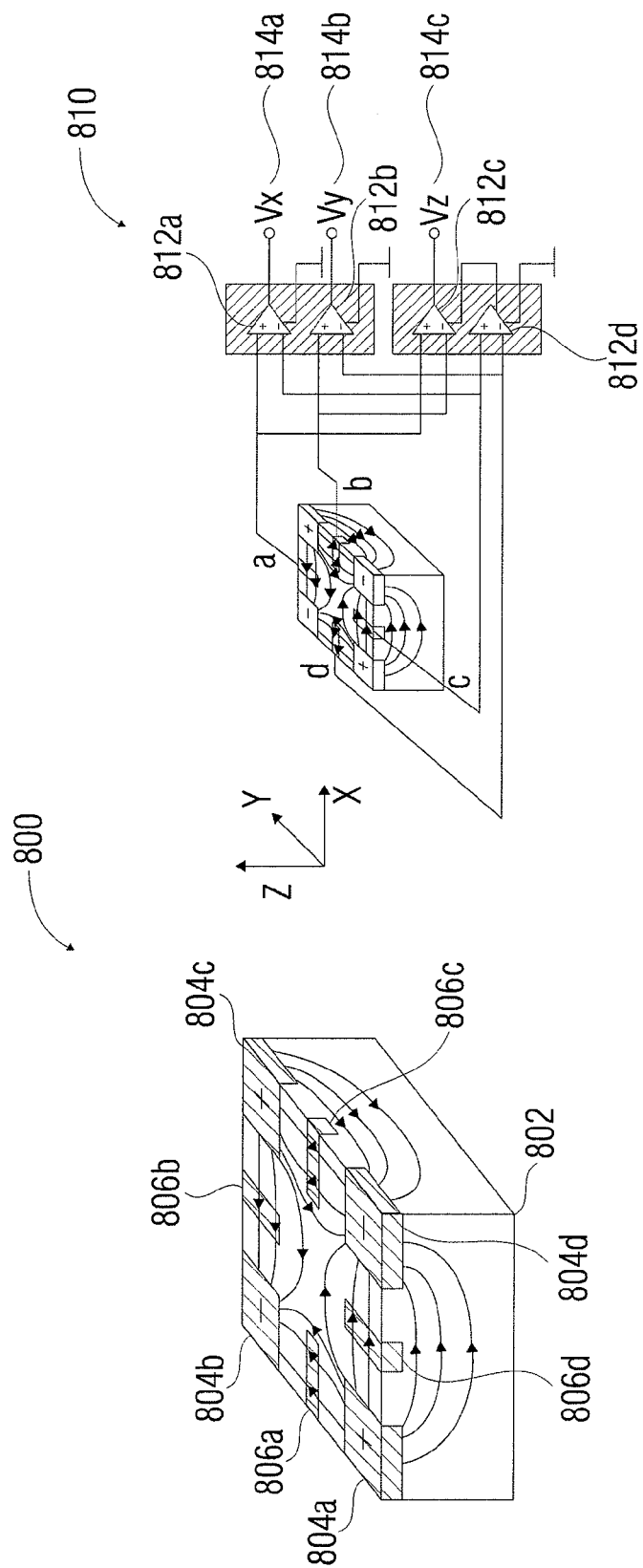
FIG. 8 shows an alternative 3D sensor for detecting spatial components of a magnetic field in accordance with conventional technology.
Figure 9:
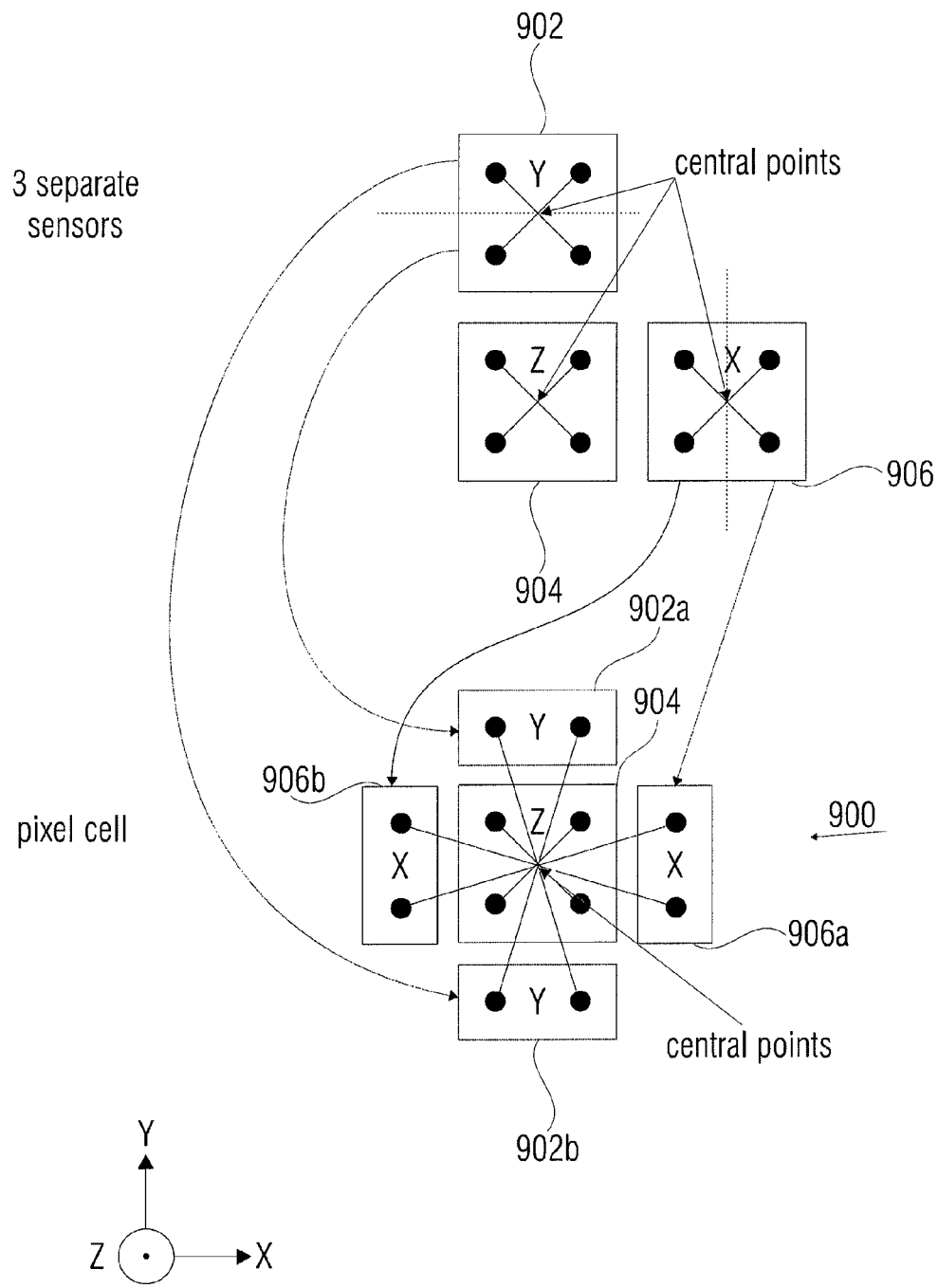
FIG. 9 shows a basic arrangement of individual Hall sensor elements for detecting a spatial magnetic field in one point.

FIG. 5 shows another embodiment of a magnetic field sensor 100. The embodiment of FIG. 5 comprises the same sensor elements (e.g. 102a-d, 104a-d, 106a-d) and the same geometry of the sensor elements and sensor element arrangements as FIG. 4, so that repeated description will be omitted. The magnetic field sensor 100 of FIG. 5 comprises only one excitation line 108, which is embodied as a coil having 1.5 windings and passing directly above the vertical sensor elements. A current $I_{k1}$ through the excitation line 108 in FIG. 5 thus flows across the sensor elements 106a, 106c, 104b and 104d twice and across the sensor elements 106d, 106b, 104a and 104c only once, whereby the difference or asymmetry of the calibration field components in the pairs of sensor elements is achieved. In further embodiments, the magnetic field sensor may also comprise a second excitation line also having 1.5 windings and may be arranged so as to be opposite, corresponding to the above description. In general, excitation lines are conceivable with various numbers of windings, which in the end comprise a partial winding for producing asymmetry of the calibration field components.

In embodiments, there are obtained various measurement processes that can be realized with one or also two excitation lines 108, 109. For example, if current is applied to a coil, c.f. FIGS. 1, 2, 3, 5 as well as the above table, all three sensor arrangements 102, 104 and 106 can be excited. On the basis of the embodiments from FIGS. 3b, 4 and the table, positive excitation of all sensor elements results from a positive current $I_{k1}$ through the coil A. Here, all horizontal sensor elements 102a-d are excited, but only the sensor elements on the left (e.g. 106b, 106d) and at the bottom (e.g. 104a, 104c) out of the vertical sensor elements. The horizontal sensor elements 102a-d are excited with the full magnetic field of the coil A, the vertical sensor elements (e.g. 104a, 104c, 106b, 106d) only with half the magnetic field, however, since only two out of four sensor elements are excited each.

In comparison thereto, if only the coil B is excited, the vertical sensor elements (e.g. 104a, 104b, 104d, 106a, 106c) experience negative excitation, and the horizontal sensor elements (e.g. 102a-d) positive excitation. Similar to the above, all horizontal sensor elements (e.g. 102a-d) are excited and thus sense the full magnetic field of the coil B. Correspondingly, only half (e.g. 104a, 104b, 104d, 106a, 106c) of the vertical sensor elements (e.g. 104a-d, 106a-d) are excited and thereby only sense half the magnetic field of the coil B.

By combining the controls of the coils A and B, the magnetic field sensors can be monitored and calibrated, in embodiments. For example, also both coils can be controlled in a positive current direction. Thereby, the horizontal sensor elements (e.g. 102a-d) are excited with twice the magnetic field, and the field may cancel itself out in the vertical sensor elements (e.g. 104a-d, 106a-d).

If both coils are excited in opposite directions, the vertical sensor elements (e.g. 104a-d, 106a-d) may be excited with the twice the field, wherein the field cancels itself out in the horizontal sensor elements (e.g. 102a-d). In further embodiments, differently strong currents may also be applied to the coils. For example, when applying current in positive direction to both coils, but with twice the current strength in the first coil A, three times the magnetic field results for the horizontal sensor elements (e.g. 102a-d), but only the single magnetic field for the vertical sensor elements (e.g. 106d, 106b, 104a, 104c). Such excitation may also be achieved by coils having partial windings, as shown in FIG. 5, for example, in other embodiments. In FIG. 5, the right-hand side of the magnetic field sensor 100 then would be excited in a dually negative way, whereas the left-hand side would be excited in a single positive way, thus amounting to three times the magnetic field. The excitation ratio of 2:1 would not be realized by way of two coils in such an embodiment, but way of one coil having 1.5 windings. In general, the coils having arbitrary numbers of windings, which allow for generating an asymmetric calibration field, are possible in embodiments, wherein arbitrary non-integer numbers of windings capable of generating an "unsymmetrical" excitation ratio are possible, for example.

If twice the current $I_{k1}$ is applied to the first coil A and current in opposite direction to the second coil B in the above example, the horizontal sensor elements (e.g. 102a-d) experience the single magnetic field, but the vertical sensors (e.g. 104a-d, 106a-d) the three times the same. According to the examples considered, many other combinations or controls to enhance and/or suppress individual magnetic field components may still be found in further embodiments.

Each of these controls has advantages, depending on which component is to be extracted or suppressed. For example, if only the vertical sensor elements (e.g. 104a-d, 106a-d) are monitored or calibrated, applying current in opposite direction to the coils could be employed. For example, if only the horizontal sensor elements (e.g. 102a-d) are excited, current in the same direction could be applied to the coils. If both, the horizontal (e.g. 102a-d) and the vertical sensor elements (e.g. 104a-d, 106a-d), are of interest, current could be applied to the individual coils successively or with different current strengths, according to the above examples.

As already explained above, one sensor element arrangement 102, 104 or 106 each may also be omitted in the embodiment explained. The concepts explained then also apply, without limitation, for the remaining two sensor element arrangements for sensing a magnetic field along two linearly independent spatial directions. What has been said with respect to the sensor elements and their embodiments each also equally applies to the embodiments of FIGS. 1a and 1b.

An additional advantage may be obtained if all sensor elements (e.g. X1-X4, Y1-Y4) are excited. This can be achieved by a second excitation line 109, c.f. FIG. 3b, to which a current then is applied in a temporally offset manner, for example, as already mentioned above. The following table summarizes the effects of applying current to the excitation line 108 and/or coil A and the excitation line 109 and/or coil B on the basis of the example of the magnetic field sensor shown in FIG. 3b. A "+" here indicates application of current and/or magnetomotive force in positive direction, a "−" in negative direction, and a "0" designates no signal at all.

| Current $I_{k1}$ Coil A | Current $I_{k2}$ Coil B | Signal X1, X2 | Signal Y1, Y2 | Signal X3, X4 | Signal Y3, Y4 | Signal X total | Signal Y total | Signal Z |
|---|---|---|---|---|---|---|---|---|
| + | 0 | + | + | 0 | 0 | + | + | + |
| − | 0 | − | − | 0 | 0 | − | − | − |
| 0 | + | 0 | 0 | − | − | − | − | + |
| 0 | − | 0 | 0 | + | + | + | + | − |
| + | + | + | + | − | − | 0 | 0 | ++ |
| + | − | + | + | + | + | ++ | ++ | 0 |
| − | + | − | − | − | − | −− | −− | 0 |
| − | − | − | − | + | + | 0 | 0 | −− |

In the above summary, it is further assumed that the current through both coils is equal. In other embodiments, as already mentioned in the previous sections, various currents and/or numbers of windings could also be used. In one embodiment, an advantage is obtained in the alternating operation of the coils. Then, signal proportions in all sensor element arrangements 102, 104 and 106 can be sensed, this being represented in the three columns on the right in the above table.

According to the above statements, not all sensor elements of a sensor element arrangement can be tested at the same time in the alternating operation. In the simultaneous operation of the coils, however, a signal that may be twice as high in comparison is obtained, wherein all sensor elements of a sensor element arrangement can be tested at the same time. Different sensor element arrangements, e.g. 104-106 (e.g. X,Y sensors) and 102 (e.g. Z sensors), can only be calibrated or tested alternately.

In summary, with respect to the inventive concept of the magnetic multi-dimensional point sensor calibratable during measurement operation, it can be stated that magnetic sensors according to the embodiments of the present invention thus can manage with only one excitation line, but offer additional monitoring and calibration possibilities with a second excitation line. They offer the advantage that all three field components can be measured in very good approximation in one point, wherein offsets, which are caused by component tolerances, contaminations in the semiconductor material, structural inhomogeneities in the semiconductor material, etc., for example, can be compensated for and the measurement values thus be made available with little offset. Through the use of the excitation loop, which may also comprise an arbitrary number of windings and/or partial windings, a simple wafer test is made possible, i.e. an on-chip test of all three sensors.

Furthermore, by combining the measurement signals from the individual excitations, it is possible to allow for a self-test with the measurement operation running, because both, measurement signal proportions originating from the measurement field components on the one hand and measurement signal proportions originating from calibration field components on the other hand, can be reduced significantly. Thus, it is possible to perform sensitivity calibration on such a magnetic field sensor during operation. The excitation loop itself may also be tested, because failure of three sensors with separate evaluation electronics is very unlikely.

In particular, it is pointed out that, depending on the conditions, the inventive scheme may also be implemented in software. The implementation may be on a digital storage medium, particularly a disk or a CD with electronically readable control signals capable of cooperating with a programmable computer system and/or microcontroller so that the corresponding method is executed. In general, the invention thus also consists in a computer program product with a program code stored on a machine-readable carrier for executing the inventive method, when the computer program is executed on a computer and/or microcontroller. In other words, the invention may thus be realized as a computer program with a program code for performing the method, when the computer program is executed on a computer and/or microcontroller.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A calibratable magnetic field sensor for sensing a first and a second spatial component of a magnetic field in a reference point, wherein the magnetic field comprises a first and a second measurement field component and/or a first and a second calibration field component, comprising:
   a first sensor element arrangement comprising at least a first and a second sensor element for sensing the first magnetic field component, which comprises a first measurement field component and/or a first calibration field component, with respect to a first spatial axis in the reference point;
   a second sensor element arrangement for sensing the second magnetic field component, which comprises a second measurement field component and/or a second calibration field component, with respect to a second spatial axis in the reference point, wherein the two spatial axes pass along linearly independent position vectors;

an excitation line arranged with respect to the first sensor element arrangement so that, when impressing a default current into the excitation line, a pair of different asymmetrical default calibration field components in the first sensor element and in the second sensor element is generated with respect to the first spatial axis.

2. The calibratable magnetic field sensor according to claim 1, wherein the second sensor element arrangement comprises at least a first and a second sensor element, and the excitation line further is arranged with respect to the second sensor element arrangement so that a second pair of different asymmetrical default calibration field components in the first sensor element and in the second sensor element is generated with respect to the second spatial axis in the sensor element arrangement.

3. The calibratable magnetic field sensor according to claim 1, further formed to sense a third spatial component of the magnetic field in the reference point, wherein the magnetic field further comprises a third measurement field component and/or a third calibration field component, and the magnetic field sensor further comprises a third sensor element arrangement for sensing the third magnetic field component, which comprises the third measurement field component and/or the third calibration field component, with respect to a third spatial axis in the reference point, wherein the three spatial axes pass along linearly independent position vectors.

4. The calibratable magnetic field sensor according to claim 3, wherein the third sensor element arrangement comprises at least a first and a second sensor element, and wherein the excitation line is arranged with respect to the third sensor element arrangement so that, when impressing a default current into the excitation line, a pair of different asymmetrical default calibration field components in the first sensor element and in the second sensor element is generated with respect to the third spatial axis in the third sensor element arrangement.

5. The magnetic field sensor according to claim 1, wherein the excitation line is formed such that it comprises a partial winding.

6. The magnetic field sensor according to claim 5, wherein the excitation line is arranged such that the coil with the at least one winding comprises shortest distances to the at least two sensor elements of a sensor element arrangement, which are different.

7. The magnetic field sensor according to claim 5, wherein the excitation line is arranged symmetrically with respect to the reference point and sweeps the sensor elements of a sensor element arrangement a different number of times.

8. The magnetic field sensor according to claim 1, wherein the excitation line is arranged such that it comprises a coil with at least one complete winding.

9. The magnetic field sensor according to claim 1, further comprising a second excitation line.

10. The magnetic field sensor according to claim 9, wherein the second excitation line is arranged with respect to the first, second or third sensor element arrangement so as to generate a first further pair of different asymmetrical default calibration field components in the first sensor element and in the second sensor element with respect to the first spatial axis in the first sensor element arrangement when impressing a further default current into the second excitation line, to generate a second further pair of different asymmetrical default calibration field components in the first sensor element and in the second sensor element with respect to the second spatial axis in the second sensor element arrangement, or to generate a third further pair of different asymmetrical default calibration field components in the first sensor element and in the second sensor element with respect to the third spatial axis in the third sensor element arrangement.

11. The magnetic field sensor according to claim 10, wherein the first excitation line and the second excitation line are arranged so that the first further pair of different asymmetrical default calibration field components is in an inverse relation with respect to each other relative to the first pair of calibration field components, the second further pair of different asymmetrical default calibration field components is in an inverse relation with respect to each other relative to the second pair of calibration field components, and the third further pair of different asymmetrical default calibration field components is in an inverse relation with respect to each other relative to the third pair of calibration field components.

12. The magnetic field sensor according to claim 1, wherein the second or third sensor element arrangement comprises a hall sensor element horizontal with respect to a main surface of the magnetic field sensor.

13. The magnetic field sensor according to claim 1, wherein the second or third sensor element arrangement comprises a plurality of hall sensor elements horizontal with respect to a main surface of the magnetic field sensor, wherein the geometrical arrangement of the plurality of horizontal hall sensor elements with respect to the reference point is symmetrical in pairs, and the hall sensor elements are coupled to each other such that the magnetic field component can be sensed in an offset-compensated manner.

14. The magnetic field sensor according to claim 1, wherein the first, second or third sensor element arrangement comprises at least two hall sensor elements vertical with respect to a main surface of the magnetic field sensor, wherein the geometrical arrangement of the at least two vertical hall sensor elements with respect to the reference point is symmetrical in pairs, and the same are coupled to each other such that the magnetic field components can be sensed in an offset-compensated manner.

15. The magnetic field sensor according to claim 1, wherein the first, second or third sensor element arrangement can be operated in the spinning current mode.

16. A method for sensing a first and a second spatial component of a magnetic field in a reference point, wherein the magnetic field comprises a first and a second measurement field component and/or a first and a second calibration field component, comprising:

sensing, in a first and a second sensor element of a first sensor element arrangement, a first pair of magnetic field components, which comprise first measurement field components and/or first calibration field components, with respect to a first spatial axis in the reference point;

sensing, in a second sensor element arrangement, second magnetic field components, which comprise second measurement field components and/or second calibration field components, with respect to a second spatial axis in the reference point, wherein the two spatial axes pass along linearly independent position vectors; and generating a first pair of different asymmetrical calibration field components with respect to the first spatial axis in the first and the second sensor element of the first sensor element arrangement.

17. The method according to claim 16, further comprising:

sensing a second pair of magnetic field components, which comprise second magnetic field components and/or second calibration field components, with respect to the second spatial axis in the reference point; and generating a second pair of different asymmetrical calibration field components with respect to the second spatial axis.

18. The method according to claim 16, further comprising:
sensing a third spatial component of the magnetic field in the reference point, wherein the magnetic field further comprises a third measurement field component and/or a third calibration field component; and
generating third calibration field components with respect to the third spatial axis, wherein the three spatial axes pass along linearly independent position vectors.

19. The method according to claim 18, further comprising:
sensing a third pair of magnetic field components, which comprise three measurement field components and/or third calibration field components, with respect to the third spatial axis in the reference point; and
generating the third pair of different asymmetrical calibration field components with respect to the third spatial axis.

20. The method according to claim 16, further comprising generating the first, second and third further calibration field components with respect to the first, second and third spatial axes and sensing the first, second and third further magnetic field components, which comprises the first, second and third further measurement field components and/or first, second and third calibration field components.

21. The method according to claim 16, further comprising:
first linearly combining the measurement signals of a magnetic field component, which are associated with the magnetic field components, to a first total measurement value, in order to reduce the influence of the measurement field component in the first total measurement value; or
second linearly combining the measurement signals of a magnetic field component, which are associated with the further magnetic field components, to a second total measurement value, in order to reduce the influence of the calibration field component in the second total measurement value.

22. The method according to claim 21, wherein first linearly combining the measurement signals of a measurement field component, which is associated with the magnetic field components or the further magnetic field components, to a first total measurement value takes place such that a proportion of the measurement field component in the first total measurement value is reduced to less than 10%, 1% or 0.1% of the first total measurement value.

23. The method according to claim 21, wherein second combining of the measurement signals of a magnetic field component, which are associated with the magnetic field components or the further magnetic field components, to a second total measurement value takes place such that the proportion of the calibration field component in the second total measurement value is reduced to less than 10%, 1% or 0.1% of the second total measurement value.

24. The method according to claim 16, further comprising combining the measurement signals of a magnetic field component, which are associated with the magnetic field components or the further magnetic field components, so that the magnetic field component is sensed in an offset-compensated manner.

25. The method according to claim 16, wherein operating phases are performed in accordance with to a spinning current method.

26. The method according to claim 16, further comprising:
storing excitation current strengths, measurement field components or calibration field components for calibration;
associating the excitation current strengths with calibration field components or magnetic field strengths; and
providing value pairs of measurement field components and magnetic field strengths.

27. A non-transitory storage medium having stored thereon a computer program a having program code for performing, when the program code is executed on a computer, a method for sensing a first and a second spatial component of a magnetic field in a reference point, wherein the magnetic field comprises a first and a second measurement field component and/or a first and a second calibration field component, the method comprising:
sensing, in a first and a second sensor element of a first sensor element arrangement, a first pair of magnetic field components, which comprise first measurement field components and/or first calibration field components, with respect to a first spatial axis in the reference point;
sensing, in a second sensor element arrangement, second magnetic field components, which comprise second measurement field components and/or second calibration field components, with respect to a second spatial axis in the reference point, wherein the two spatial axes pass along linearly independent position vectors; and
generating a first pair of different asymmetrical calibration field components with respect to the first spatial axis in the first and the second sensor element of the first sensor element arrangement.

* * * * *